United States Patent
Yasui

(10) Patent No.: US 7,488,283 B2
(45) Date of Patent: Feb. 10, 2009

(54) CIRCUIT-SUBSTRATE-RELATED-OPERATION PERFORMING APPARATUS, AND METHOD OF SUPPLYING CONSTITUENT ELEMENT TO THE APPARATUS

(75) Inventor: Yoshihiro Yasui, Nagoya (JP)

(73) Assignee: Fuji Machine MFG. Co., Ltd., Aichi (JP)

( * ) Notice: Subject to any disclaimer, the term of this patent is extended or adjusted under 35 U.S.C. 154(b) by 458 days.

(21) Appl. No.: 10/541,800

(22) PCT Filed: Jan. 15, 2004

(86) PCT No.: PCT/JP2004/000257

§ 371 (c)(1),
(2), (4) Date: Jul. 8, 2005

(87) PCT Pub. No.: WO2004/066701

PCT Pub. Date: Aug. 5, 2004

(65) Prior Publication Data

US 2006/0111222 A1 May 25, 2006

(30) Foreign Application Priority Data

Jan. 17, 2004 (JP) .............................. 2003-009814

(51) Int. Cl.
*B23Q 3/155* (2006.01)
(52) U.S. Cl. .................. 483/1; 483/16; 483/9; 29/743; 29/832
(58) Field of Classification Search ...................... 483/1, 483/9, 7–8, 10–11, 14–15, 16, 63–64; 29/739, 29/740, 742, 743, 832
See application file for complete search history.

(56) References Cited

U.S. PATENT DOCUMENTS 4,831,721 A * 5/1989 Hirai et al. .................. 483/902

(Continued)

FOREIGN PATENT DOCUMENTS

JP        A 04-123493        4/1992

(Continued)

OTHER PUBLICATIONS

Full text translation of JP-04-123493.*

*Primary Examiner*—Erica E Cadugan
(74) *Attorney, Agent, or Firm*—Oliff & Berridge, PLC

(57) ABSTRACT

A component mounting apparatus including an exchangeable suction nozzle is easily supplied with another suction nozzle to replace the former suction nozzle. A plurality of mounting modules 12 having respective identical constructions are arranged adjacent to each other such that the mounting modules are oriented in a same direction, so that the mounting modules 12 constitute a mounting-apparatus line. When the mounting-apparatus line is reset, a mounting head 40 is used to exchange automatically suction nozzles 158 between a nozzle stocker 330 and a nozzle carrier plate 400, so that a current arrangement of suction nozzles on the nozzle stocker 330 is changed to a new arrangement of suction nozzles for the next component mounting operation. The nozzle carrier plate 400 can hold a plurality of sorts of suction nozzles 158 that are needed for the next component mounting operation but are not held by the mounting modules 12. A wiring-board conveying device 34 is used to convey sequentially the nozzle carrier plate 400 to each of the mounting modules 12 and, in a state in which the nozzle carrier plate 400 is positioned and held, one or more unnecessary suction nozzles 158 are returned to the nozzle carrier plate 400 and one or more suction nozzles 158 needed for the next mounting operation are held by one or more vacant nozzle holders.

15 Claims, 19 Drawing Sheets

U.S. PATENT DOCUMENTS

| | | | |
|---|---|---|---|
| 5,253,414 A * | 10/1993 | Gaudette et al. | 29/740 |
| 5,692,292 A * | 12/1997 | Asai et al. | 29/740 |
| 6,154,954 A * | 12/2000 | Seto et al. | 29/740 |
| 6,199,272 B1 * | 3/2001 | Seto et al. | 29/740 |
| 6,334,840 B1 | 1/2002 | Asai et al. | |
| 6,466,837 B1 * | 10/2002 | Mimura et al. | 700/121 |
| 6,735,856 B1 * | 5/2004 | Kitamura et al. | 29/833 |
| 6,773,381 B2 * | 8/2004 | Andersch | 483/16 |
| 2006/0085973 A1 * | 4/2006 | Kodama et al. | 29/740 |

FOREIGN PATENT DOCUMENTS

| | | |
|---|---|---|
| JP | A 06-045794 | 2/1994 |
| JP | A 06-291490 | 10/1994 |
| JP | A 06-342998 | 12/1994 |
| JP | A 08-046392 | 2/1996 |
| JP | A 11-138367 | 5/1999 |
| JP | A 11-170121 | 6/1999 |
| JP | A 11-220294 | 8/1999 |
| JP | A 2000-124690 | 4/2000 |

* cited by examiner

CIRCUIT-SUBSTRATE-RELATED-OPERATION PERFORMING APPARATUS, AND METHOD OF SUPPLYING CONSTITUENT ELEMENT TO THE APPARATUS

TECHNICAL FIELD

The present invention relates to a substrate-related-operation performing apparatus that performs a predetermined operation related to a circuit substrate such as a printed wiring board, and particularly to the art of supplying an exchangeable constituent element of a substrate-related-operation performing apparatus.

BACKGROUND ART

In a substrate-related-operation performing apparatus such as an electronic-circuit-component mounting apparatus that mounts an electronic-circuit component on a circuit substrate, if a current sort of circuit substrates are changed to a new sort of circuit substrates, it is often desirable to change at least one constituent portion of the apparatus. To this end, the apparatus includes at least one constituent element that is detachably attached thereto, and the current constituent element corresponding to the current sort of circuit substrates is exchanged with another constituent element corresponding to the new sort of circuit substrates. An example of the electronic-circuit-component mounting apparatus is disclosed by Japanese Patent Application Publication No. 8-46392. The disclosed apparatus includes a rotatable body that is intermittently rotatable about an axis line; and a plurality of nozzle holding portions that are supported by an outer portion of the rotatable body, such that the nozzle holding portions are equidistantly spaced from each other, and that hold a plurality of suction nozzles, respectively, each of which holds, by suction, an electronic-circuit component. Thus, the respective components held by the suction nozzles are intermittently revolved about the above-indicated axis line. In this electronic-circuit-component mounting apparatus, first, an operator detaches, from the nozzle holding portions, one or more suction nozzles that are not needed to mount electronic-circuit components on the next sort of circuit substrates, and additionally places a nozzle stocker holding a plurality of suction nozzles, on an X-Y table. Subsequently, as the rotatable body is intermittently rotated, each of the nozzle holding portions is sequentially positioned at a predetermined angular phase, while the X-Y table moves the nozzle stocker so as to position one of the suction nozzles held thereby, at a position right below an empty one of the nozzle holding portions. In this state, when the empty nozzle holder portion is lowered, the one suction nozzle is attached to the nozzle holding portion.

DISCLOSURE OF THE INVENTION

In the above-indicated electronic-circuit-component mounting apparatus, the suction nozzles are automatically attached to the nozzle holding portions, respectively. Therefore, a total number of steps needed to perform a resetting operation when a current sort of circuit substrates are changed to a new sort of circuit substrates can be reduced. However, depending upon a specific construction of the electronic-circuit-component mounting apparatus, it may not be easy for the operator to place the nozzle stocker at the predetermined position. For example, recently, the overall size of electronic-circuit-component mounting apparatuses has been reduced to such an extent that an operator cannot easily gain access to an inner space of each apparatus. In addition, a plurality of electronic-circuit-component mounting apparatuses may be given in the form of modules that are arranged adjacent to each other and cooperate with each other to perform a component mounting operation on each circuit substrate.

The above-explained problems relate to the electronic-circuit-component mounting apparatus as one example of the substrate-related-operation performing apparatus that performs the predetermined operation related to the circuit substrate. However, similar problems generally occur to the substrate-related-operation performing apparatus, such as an adhesive dispenser that applies adhesive in the form of spots, to a circuit substrate so as to fix electronic-circuit components to the substrate, or an inspecting apparatus that inspects an electronic circuit such as a produced printed circuit board.

It is therefore an object of the present invention to provide the art of easily supplying a constituent element to be exchanged with an exchangeable constituent element of a substrate-related-operation performing apparatus. This object may be achieved according to any of the following modes of the present invention in the form of a method of supplying a constituent element to a substrate-related-operation performing apparatus or an electronic-circuit-component mounting apparatus; a method of exchanging constituent elements in a substrate-related-operation performing apparatus or an electronic-circuit-component mounting apparatus; a substrate-related-operation performing apparatus; and an electronic-circuit-component mounting apparatus, each of which is numbered like the appended claims and may depend from the other mode or modes, where appropriate, to indicate and clarify possible combinations of technical features. It is, however, to be understood that the present invention is not limited to the technical features or any combinations thereof that will be described below for illustrative purposes only. It is to be further understood that a plurality of features included in any one of the following modes of the invention are not necessarily provided altogether, and that the invention may be embodied without at least one of the features described with respect to each of the modes.

(1) A method of supplying, to an operation performing apparatus which performs a predetermined operation related to a circuit substrate, such as a printed wiring board, that is conveyed thereto by a substrate conveyor, at least one constituent element of the operation performing apparatus, the method being characterized by comprising the step of causing an element carrier plate to hold said at least one constituent element, causing the substrate conveyor to convey the element carrier plate to the operation performing apparatus, and thereby supplying said at least one constituent element to the operation performing apparatus.

The constituent element supplied by the present method may be an element that is commonly used in all sorts of substrate-related operations, or an element that is exclusively used in a specific sort of substrate-related operation. The former element is, e.g., a support pin that supports a lower surface of a circuit substrate; a marker that puts a mark; or a jig that is used in inspecting an accuracy of the operation performing apparatus. The latter element is, e.g., an assembly including an applying nozzle that applies adhesive, and a syringe that stores the adhesive; a suction nozzle that holds, by suction, an electronic-circuit component; or an inspecting probe that inspects an electronic circuit. More specifically explained, the support pin is placed on a support plate, so as to support a circuit substrate having one or more electronic-circuit components fixed to a lower surface thereof, by engaging that lower surface. The marker is held by an operation performing head, so as to automatically put, to the support plate, a mark indicating a position where an operator should place the support pin. The jig is used in detecting, e.g., an accuracy of positioning of the operation performing head, or a relative position between the head and an image taking device. For example, there is known an electronic-circuit-component mounting apparatus that can inspect an accuracy of its own, in such a manner that a standard nozzle is held by a mounting head so that an image taking device takes an image of an end surface of the standard nozzle, that a gauge is held by a component holder so that an image taking device takes an image of the gauge, or that a mounting head is used to place a standard chip at a predetermined position so that an image taking device takes an image of the standard chip. The standard nozzle, the gauge, or the standard chip is an example of the above-indicated jig. It is desirable that the operation performing apparatus employ a handling device that automatically handles the jig. However, the supplied jig may be handled by an operator such that the jig is held by an appropriate portion of the operation performing apparatus. The assembly including the adhesive applying nozzle and the adhesive storing syringe is detachably attached to a head of an adhesive dispenser that applies adhesive in the form of spots, to a circuit substrate; and the inspecting probe is caused to contact a predetermined portion of a produced printed circuit board, so as to electrically inspect the printed circuit board.

According to the present invention, the substrate conveyor that conveys the circuit substrate as an object of operation of the operation performing apparatus, is used to convey and supply the constituent element of the apparatus itself. Thus, the constituent element can be easily supplied to the apparatus.

(2) A method of, in an operation performing apparatus which performs a predetermined operation related to a circuit substrate, such as a printed wiring board, that is conveyed thereto by a substrate conveyor, and which has a function of automatically exchanging at least one first constituent element thereof with at least one second constituent element thereof, exchanging said at least one first constituent element with said at least one second constituent element, the method being characterized by comprising the step of causing an element carrier plate to hold said at least one second constituent element, causing the substrate conveyor to convey the element carrier plate to the operation performing apparatus, and causing the operation performing apparatus to exchange automatically said at least one first constituent element thereof, with said at least one second constituent element held by the element carrier plate.

The operation performing apparatus may incorporate a stocker that holds one or more off-duty constituent elements of the apparatus, and may automatically exchange constituent elements between the stocker and an element holding portion of the apparatus. In this case, the present method can be applied to the exchange of constituent elements between the element carrier plate and the stocker. On the other hand, in the case where the operation performing apparatus does not have such a stocker, the present method can be applied to the exchange of constituent elements between the element carrier plate and the element holding portion of the apparatus. The present method is particularly advantageously applied to the case where a plurality of operation performing apparatuses are arranged adjacent to each other and an operator cannot easily gain access to the inner space of each apparatus. However, the present method can be applied to other cases.

(3) A method of supplying at least one suction nozzle to a component mounting apparatus which has a mounting head including at least one nozzle-holding portion which holds said at least one suction nozzle such that said at least one suction nozzle is detachable from said at least one nozzle-holding portion, and which uses said at least one suction nozzle to hold, by suction, at least one electronic-circuit component and mount said at least one electronic-circuit component on a circuit substrate that is conveyed by a substrate conveyor and is held by a substrate holding device, the method being characterized by comprising the step of causing a nozzle carrier plate to hold said at least one suction nozzle, causing the substrate conveyor to convey the nozzle carrier plate to the component mounting apparatus, and causing said at least one nozzle-holding portion of the mounting head to hold said at least one suction nozzle held by the nozzle carrier plate.

The present invention is obtained by applying the invention according to the mode (1), to the supply of suction nozzle or nozzles to the component mounting apparatus. Recently, the number of sorts of electronic-circuit components to be mounted by an electronic-circuit-component mounting apparatus has been increased, and accordingly the number of sorts of suction nozzles needed to mount those components has been increased. Therefore, the present invention is very advantageous. The present invention is particularly advantageously applied to an X-Y-robot-type electronic-circuit-component mounting apparatus wherein a mounting head is moved by an X-Y robot. However, the present invention can be applied to a head-revolution-type electronic-circuit-component mounting apparatus wherein a plurality of mounting heads are intermittently revolved about a common axis line, while a circuit substrate is moved by an X-Y table to an arbitrary position on an X-Y coordinate plane, and a component supplying device is moved in a direction tangent to a locus of revolution of each of the mounting heads. In the latter case, each mounting head can be stopped at only a predetermined position. However, since the substrate holding device that holds the circuit substrate conveyed by the substrate conveyor, is held and moved by the X-Y table, the nozzle carrier plate can be moved, in place of the circuit substrate, by the X-Y table to an arbitrary position on the X-Y coordinate plane, and accordingly can be positioned at an arbitrary position relative to the each mounting head. Though at least a portion of the substrate holding device may be provided by at least a portion of the substrate conveyor, the substrate holding device may be provided completely independent of the substrate conveyor.

(4) A method of, in a component mounting apparatus which has a mounting head including at least one nozzle-holding portion that holds at least one first suction nozzle such that said at least one first suction nozzle is detachable from said at least one nozzle-holding portion, which uses said at least one first suction nozzle to hold, by suction, at least one electronic-circuit component and mount said at least one electronic-circuit component on a circuit substrate that is conveyed by a substrate conveyor and is held by a substrate holding device, and which can automatically exchange said at least one first suction nozzle held by said at least one nozzle-holding portion, with at least one first suction nozzle held by a nozzle stocker, exchanging said least one first suction nozzle held by the nozzle stocker, the method being characterized by comprising the step of causing a plurality of nozzle-holding portions of a nozzle carrier plate to hold a plurality of second suction nozzles, respectively, causing the substrate conveyor to convey the nozzle carrier plate to the component mounting apparatus, and causing said at least one nozzle-holding portion of the mounting head to exchange automatically said at least one first suction nozzle held by the nozzle stocker, with at least one of the second suction nozzles held by the nozzle carrier plate.

The present invention is obtained by applying the invention according to the mode (2), to the exchange of suction nozzles in the component mounting apparatus.

(5) The method according to the mode (4), wherein a plurality of said component mounting apparatuses are arranged to constitute a component-mounting-apparatus line, and wherein the substrate conveyor is caused to convey the nozzle carrier plate to an arbitrary one of the component mounting apparatuses, and said at least one first suction nozzle held by the nozzle stocker of the arbitrary component mounting apparatus is automatically exchanged with said at least one second suction nozzle held by the nozzle carrier plate.

The nozzle carrier plate may hold the suction nozzle or nozzles for the plurality of component mounting apparatuses, or hold the suction nozzle or nozzles for a particular one of the component mounting apparatuses. In the former case, the nozzle carrier plate may be sequentially stopped in each of the component mounting apparatuses, in an order from the most upstream apparatus toward the most downstream apparatus, so that the suction nozzle or nozzles held by the nozzle stocker of the each apparatus is automatically exchanged with the suction nozzle or nozzles held by the nozzle carrier plate.

(6) The method according to the mode (5), wherein the plurality of component mounting apparatuses comprise a plurality of modules, respectively, which have respective identical constructions and which are arranged adjacent to each other to constitute the component-mounting-apparatus line, and wherein said at least first suction nozzle held by the nozzle stocker of an arbitrary one of the modules is automatically exchanged with said at least one second suction nozzle held by the nozzle carrier plate.

In the component-mounting-apparatus line constituted by the component mounting apparatuses in the form of modules, it is often needed to exchange suction nozzles between the nozzle carrier plate and the respective nozzle stockers of many modules. However, since the modules are arranged adjacent to each other, the operator cannot easily gain access to the interior of each module and accordingly cannot easily exchange suction nozzles. Hence, the present invention can be advantageously applied.

(7) An operation performing apparatus including a substrate conveyor which conveys a circuit substrate, and an operation performing device which performs a predetermined operation related to the circuit substrate conveyed by the substrate conveyor, the apparatus being characterized by further comprising an element carrier plate which includes at least one element-holding portion that can hold at least one constituent element of the apparatus, and which can be conveyed by the substrate conveyor, wherein the substrate conveyor is caused to convey the element carrier plate to the apparatus and thereby supply said at least one constituent element to the apparatus.

The present invention relates to an apparatus that can advantageously carry out the constituent-element supplying method according to the mode (1). Therefore, the description provided with respect to the mode (1) can apply as it is to the present invention.

(8) An operation performing apparatus including a substrate conveyor which conveys a circuit substrate, and an operation performing device which performs a predetermined operation related to the circuit substrate conveyed by the substrate conveyor, the apparatus being characterized by further comprising an element stocker which includes at least one stocker-side element-holding portion that can hold at least one first constituent element of the apparatus;

an element carrier plate which includes at least one plate-side element-holding portion that can hold at least one second constituent element of the apparatus, and which can be conveyed by the substrate conveyor; and an exchanging device which exchanges said at least one first constituent element held by the element stocker, with said at least one second constituent element held by the element carrier plate conveyed by the substrate conveyor.

The present invention relates to an apparatus that can advantageously carry out the constituent-element exchanging method according to the mode (2). Therefore, the description provided with respect to the mode (2) can apply as it is to the present invention.

(9) The operation performing apparatus according to the mode (8), wherein each one of said at least one first constituent element and said at least one second constituent element has an identification-code recording portion where an identification code which identifies said each one constituent element from an other of said at least one first constituent element and said at least one second constituent element is recorded, wherein the apparatus further comprises a reading device which reads the respective identification codes from the respective identification-code recording portions of said at least one first constituent element and said at least one second constituent element, and wherein the exchanging device exchanges, based on the respective identification codes read by the reading device, said at least one first constituent element held by the element stocker, with said at least one second constituent element held by the element carrier plate.

(10) The operation performing apparatus according to the mode (9), further comprising an element-code memory in which the respective identification codes of said at least one first constituent element held by the element stocker and said at least one second constituent element held by the element carrier plate are stored, wherein the exchanging device exchanges, based on the respective identification codes stored in the element-code memory and the respective identification codes read by the reading device, said at least one first constituent element held by the element stocker, with said at least one second constituent element held by the element carrier plate.

(11) A component mounting apparatus, characterized by comprising a substrate conveyor which conveys a circuit substrate;

a substrate holding device which holds the circuit substrate conveyed by the substrate conveyor;

a mounting head which includes at least one head-side nozzle-holding portion that holds at least one first suction nozzle such that said at least one first suction nozzle is exchangeable, and which uses said at least one first suction nozzle to hold, by suction, at least one electronic-circuit component and mount said at least one electronic-circuit component on the circuit substrate held by the substrate holding device;

a moving device which moves at least one of the mounting head and the substrate holding device relative to an other of the mounting head and the substrate holding device;

a nozzle carrier plate which can be conveyed by the substrate conveyor and can be held by the substrate holding device, and which includes at least one plate-side nozzle-holding portion that holds at least one second suction nozzle; and a nozzle-receiving control device which controls the moving device so that said at least one head-side nozzle-holding portion of the mounting head holds said at least one second suction nozzle held by the nozzle carrier plate held by the substrate holding device.

The present invention relates to an apparatus that can advantageously carry out the suction-nozzle supplying method according to the mode (3). Therefore, the description provided with respect to the mode (3) can apply as it is to the present invention.

(12) A component mounting apparatus, characterized by comprising a substrate conveyor which conveys a circuit substrate;

a substrate holding device which holds the circuit substrate conveyed by the substrate conveyor;

a mounting head which includes at least one head-side nozzle-holding portion that holds at least one first suction nozzle such that said at least one first suction nozzle is exchangeable, and which uses said at least one first suction nozzle to hold, by suction, at least one electronic-circuit component and mount said at least one electronic-circuit component on the circuit substrate held by the substrate holding device;

a moving device which moves at least one of the mounting head and the substrate holding device relative to an other of the mounting head and the substrate holding device;

a nozzle stocker which includes at least one stocker-side nozzle-holding portion that holds at least one first suction nozzle that is exchanged with said at least one first suction nozzle held by said at least one head-side nozzle-holding portion of the mounting head;

a nozzle carrier plate which can be conveyed by the substrate conveyor and can be held by the substrate holding device, and which includes at least one plate-side nozzle-holding portion that holds at least one second suction nozzle; and a nozzle-exchange control device which controls the moving device so that said at least one head-side nozzle-holding portion of the mounting head exchanges said at least one first suction nozzle held by the nozzle stocker, with said at least one second suction nozzle held by the nozzle carrier plate held by the substrate holding device.

The present invention relates to an apparatus that can advantageously carry out the suction-nozzle exchanging method according to the mode (4). Therefore, the description provided with respect to the mode (4) can apply as it is to the present invention. In addition, the feature according to each of the mode (9) and the mode (10) can be applied to the component mounting apparatus according to the present mode.

(13) The component mounting apparatus according to the mode (11) or (12), wherein the mounting head includes a rotatable body which is rotatable about an axis line thereof, and a plurality of said head-side nozzle-holding portions which are held by respective portions of the rotatable body that are located on a circle whose center is located on the axis line of the rotatable body, and which include respective end portions that hold the respective first suction nozzles such that each of the respective first suction nozzles is detachable from a corresponding one of the head-side nozzle-holding portions.

(14) The component mounting apparatus according to any of the modes (11) through (13), wherein the nozzle carrier plate has a plurality of fiducial marks whose images can be taken by an image taking device, wherein the apparatus further comprises a mark-image taking device which takes the respective images of the fiducial marks, and wherein the nozzle-receiving control device or the nozzle-exchange control device controls the moving device, based on results of processing of the images taken by the mark-image taking device.

BEST MODE FOR CARRYING OUT THE INVENTION

Figure 1:
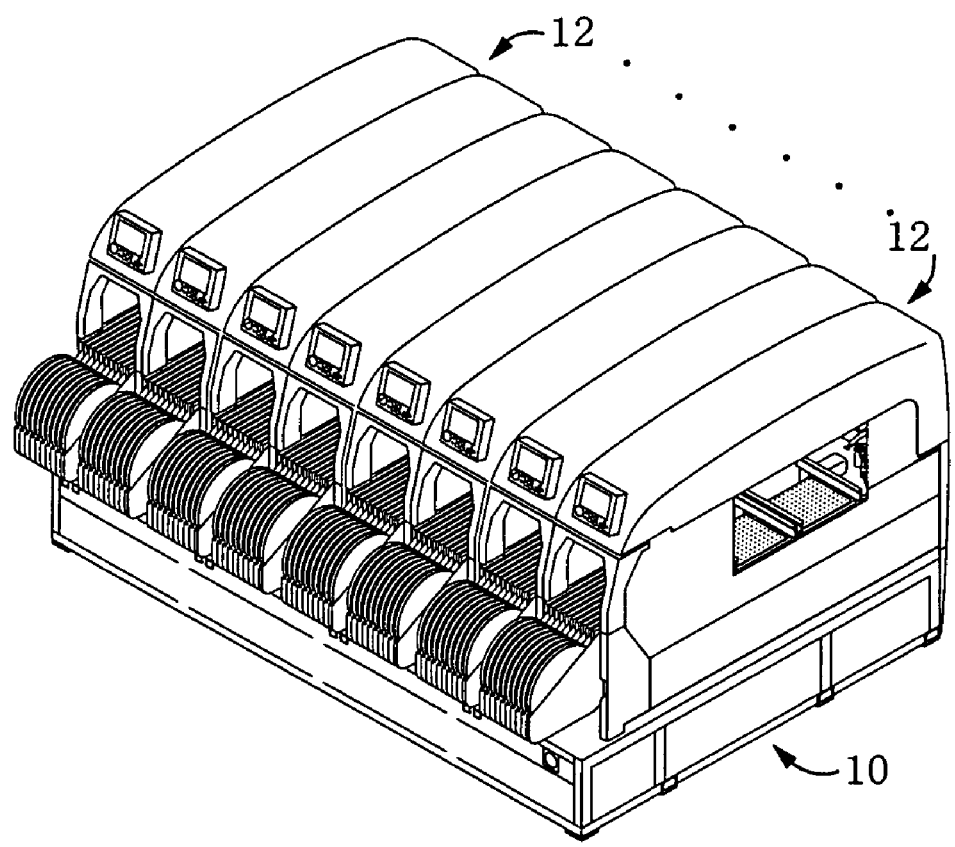
FIG. 1 is a perspective view of a general arrangement of an electronic-circuit-component mounting system as an embodiment of the present invention.

FIG. 1 shows one basic embodiment of a circuit-substrate-related-operation performing system. More specifically described, the basic system shown in FIG. 1 is an electronic-circuit-component mounting system (hereinafter, abbreviated to the "mounting system" where appropriate) that performs an electronic-circuit-component mounting operation. The mounting system includes a system base 10, and a plurality of mounting modules 12 each as an electronic-circuitcomponent mounting apparatus that have respective identical constructions and that are arranged adjacent to each other, and are oriented in a same direction, in a mounting-apparatus line. A direction in which the mounting modules 12 are arranged will be referred to as an X-axis direction; and a direction perpendicular to the X-axis direction on a horizontal plane will be referred to as a Y-axis direction.

Figure 2:
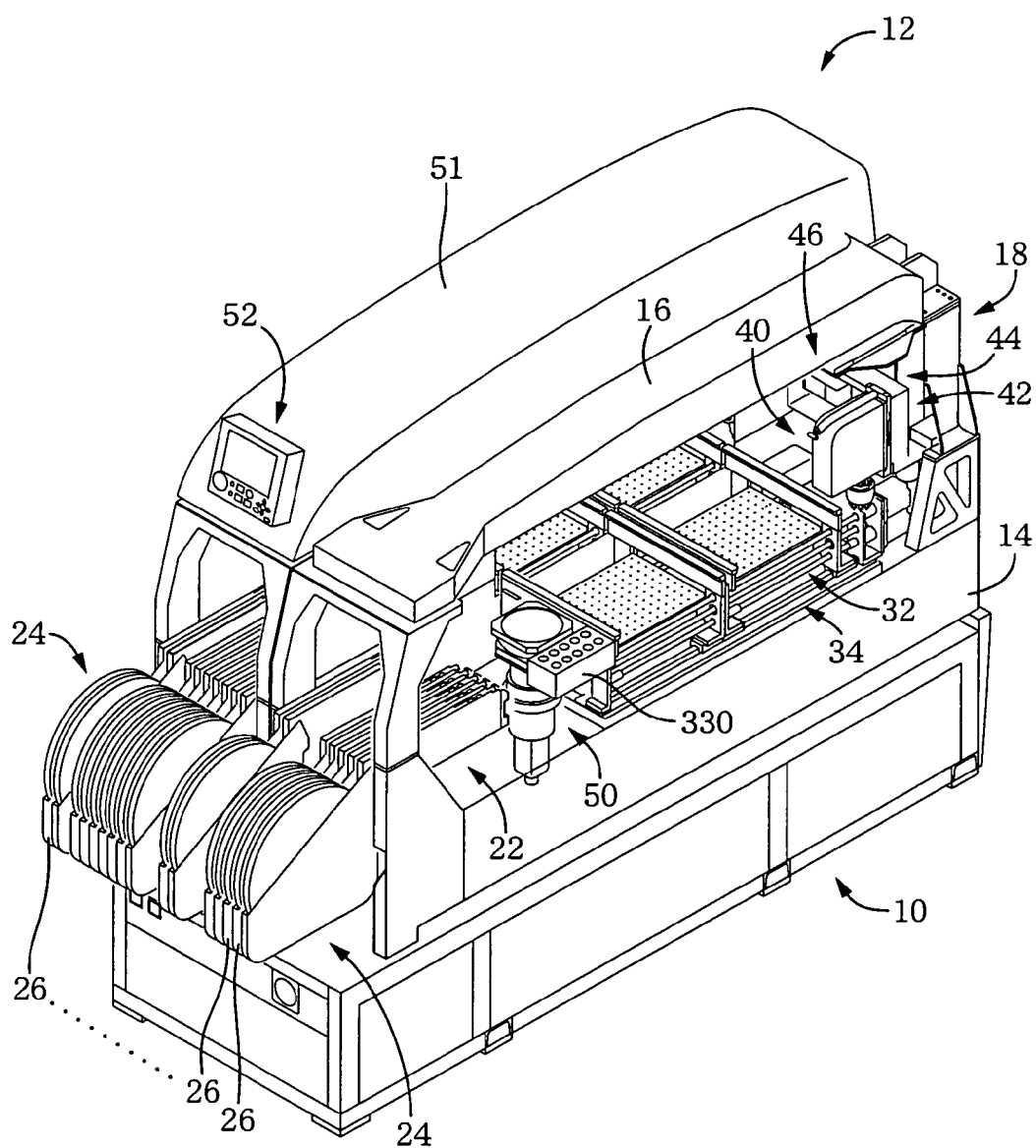
FIG. 2 is a perspective view showing circuit-component mounting apparatuses constituting the electronic-circuit-component mounting system, in a state in which exterior components are removed from one of the circuit-component mounting apparatuses.

FIG. 2 is a perspective view of two mounting modules 12 of the above-indicated mounting system, in a state in which a portion of exterior components of one of the two modules 12 is removed. Each of the mounting modules 12 includes a main body 18 that includes a frame portion 14 and a beam portion 16 provided above the frame portion 14. In addition, the each mounting module 12 includes a component supplying portion 22 provided in a front portion of the frame portion 14 of the main body 18. The component supplying portion 22 includes a supplying-device support portion, not shown, to which either a feeder-type component supplying device 24 or a tray-type component supplying device is attached. FIG. 2 shows a state in which the feeder-type component supplying device 24 is attached.

The feeder-type component supplying device 24 includes a plurality of tape feeders (hereinafter, abbreviated to the "feeders") 26, each as a component feeder, each of which supplies electronic-circuit components (hereinafter, abbreviated to the "components") 25 (see FIG. 7), one by one, from a component carrier tape that carries the components 25; and a feeder palette as a feeder holder that holds the feeders 26 such that each of the feeders 26 is detachable from the palette. The feeder-type component supplying device 24 is a sort of electronic-circuit-component supplying device, and is essentially constituted by the feeders 26 each of which supplies the components 25 in the form of the component carrier tape wound around a reel. Each of the feeders 26 stores components 25 of one sort, and supplies the components 25 from a predetermined component-supply portion thereof. The feeder palette is detachably attached to the frame portion 14. Thus, desirable sorts of feeders 26 corresponding to desirable sorts of components 25 can be arranged in a desirable order on the feeder palette.

Figure 10:
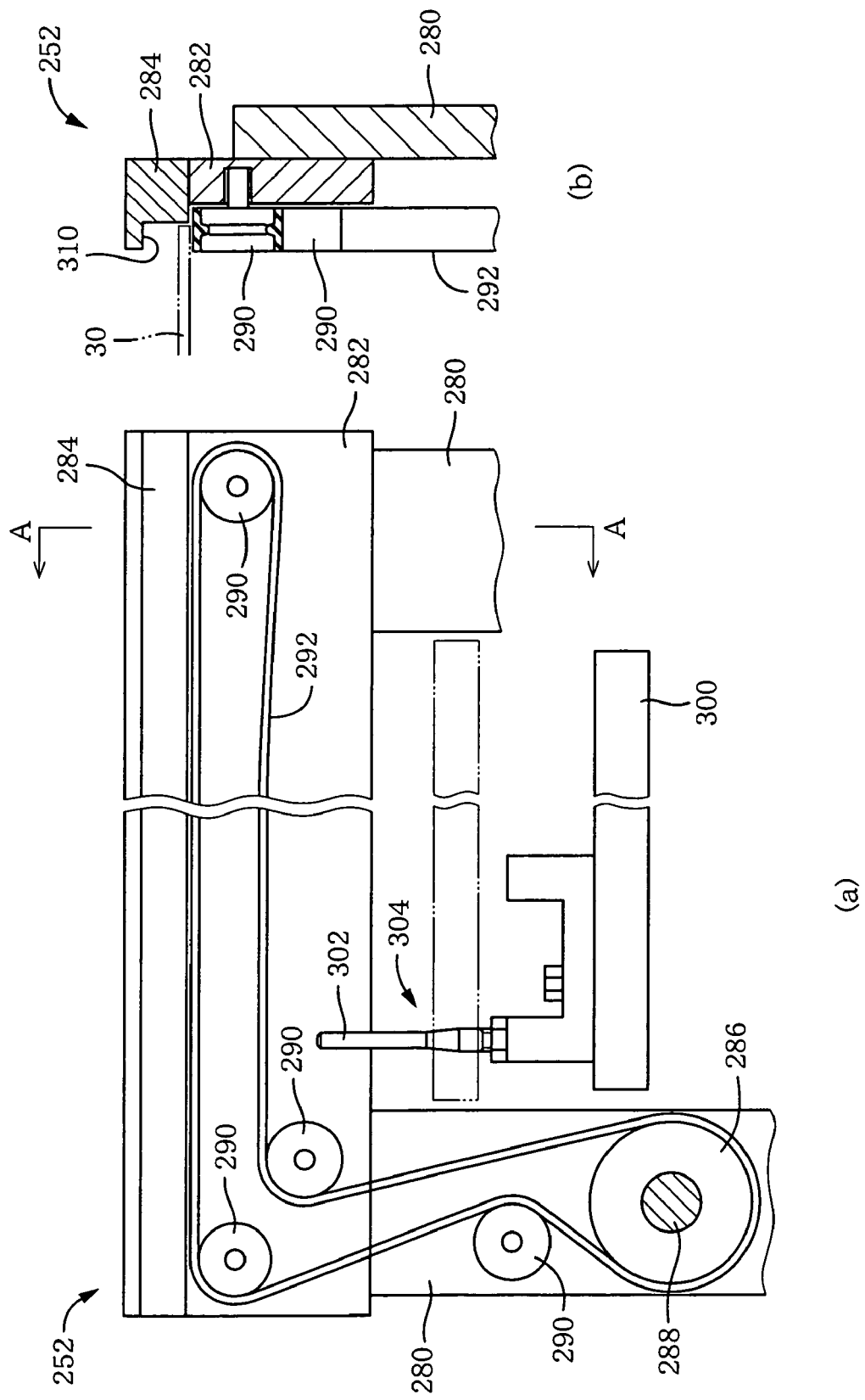
FIG. 10(a) is a front view of a conveyor rail of the wiring-board conveying device.
FIG. 10(b) is a cross-section view taken along A-A in FIG. 10(a).

Each of the mounting modules 12 includes a wiring-board conveying device 34 that conveys a printed wiring board (hereinafter, abbreviated to the wiring board) 30 (see FIG. 10) as a sort of circuit substrate and that also functions as a wiring-board holding device 32 as a substrate holding device that fixes and holds the wiring board 30 at a predetermined position. In the present mounting system, the wiring board 30 is conveyed in the X-axis direction in which the mounting modules 12 are arranged. Thus, the X-axis direction is a wiring-board conveying direction (i.e., a substrate conveying direction) in the present mounting system. The wiring-board conveying device 34 will be described later.

In addition, each of the mounting modules 12 includes a mounting head 40 (as a sort of operation performing head) that takes the components 25 from the component supplying device 24 attached to the component supplying portion 22, and mounts the components 25 on the wiring board 30 held by the wiring-board conveying device 34. Thus, the each mounting module 12 includes a component mounting portion 42. The mounting head 40 is moved between the component supplying portion 22 (i.e., the component supplying device 24 attached to the component supplying portion 22) and the wiring-board conveying device 34, by a mounting-head moving device (hereinafter, abbreviated to the "head moving device") 44 as an X-Y-robot-type moving device that is supported by the beam portion 16 of the each mounting module 12. The mounting head 40 and the head moving device 44 cooperate with each other to constitute a component mounting device 46 as an operation performing device.

Each of the mounting modules 12 further includes a component-image taking device 50 that includes a CCD (charge-coupled device) camera and is supported by the frame portion 14 such that the component-image taking device 50 is located between the component supplying portion 22 and the wiring-board conveying device 34. The component-image taking device 50 takes a posture, etc of each of the components 25 held by the mounting head 40. In addition, the each mounting module 12 has, in front of a top cover 51 as one of the exterior components thereof, an operation panel 52 as an input and output device. Moreover, the each mounting module 12 has a mounting-module control device 500 (see FIG. 17) that is essentially constituted by a computer and controls the various devices including the component supplying device 24 attached to the component supplying portion 22; and an image processing unit 528 (see FIG. 17) that processes image data representing the image taken by the component-image taking device 50.

Thus, each of the mounting modules 12 includes the component supplying portion 22, the component mounting portion 42, and the substrate holding portion. The each mounting module 12 incorporates the wiring-board conveying device 34. As will be described in detail later, the each mounting module 12 has such a construction that assures that the module 12 is easily separable from the system base 10. Thus, the mounting modules 12 can be arranged in different orders. In addition, the each mounting module 12 is a movable apparatus that is movable relative to the system base 10 in frontward and rearward directions that are perpendicular to the wiring-board conveying direction and are substantially horizontal.

Figure 3:
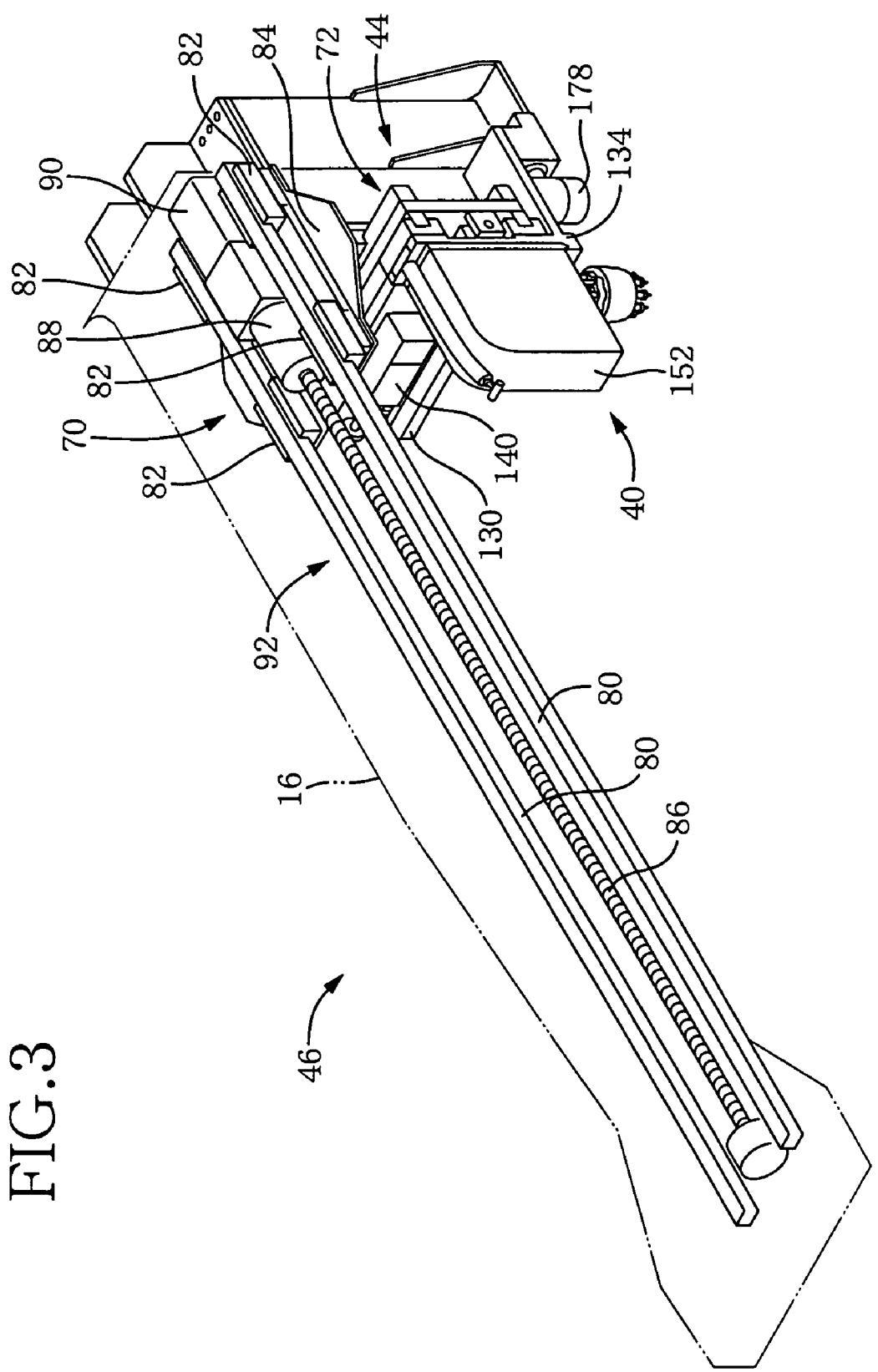
FIG. 3 is a perspective view of a mounting head and a head moving device that are employed by a mounting module constituting a portion of the electronic-circuit-component mounting system.
Figure 4:
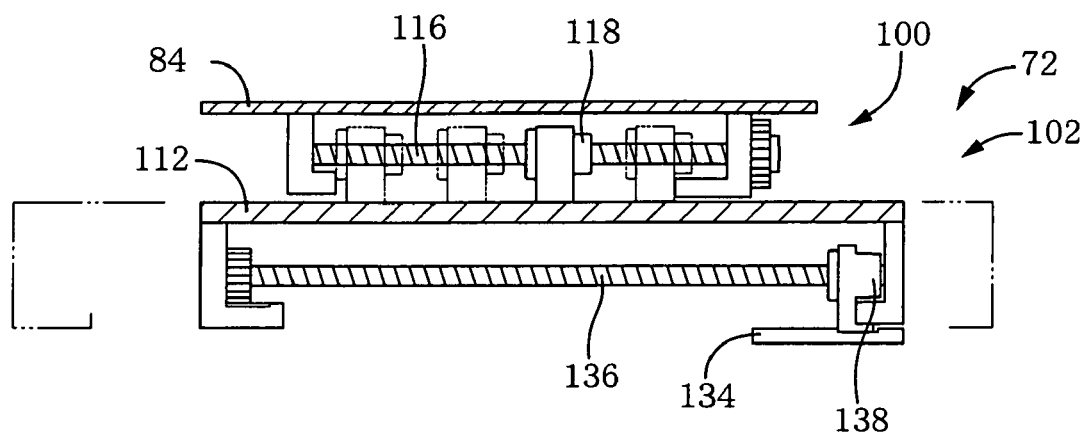
FIG. 4 is a plan cross-section view of an X slide device of the head moving device.
Figure 5:
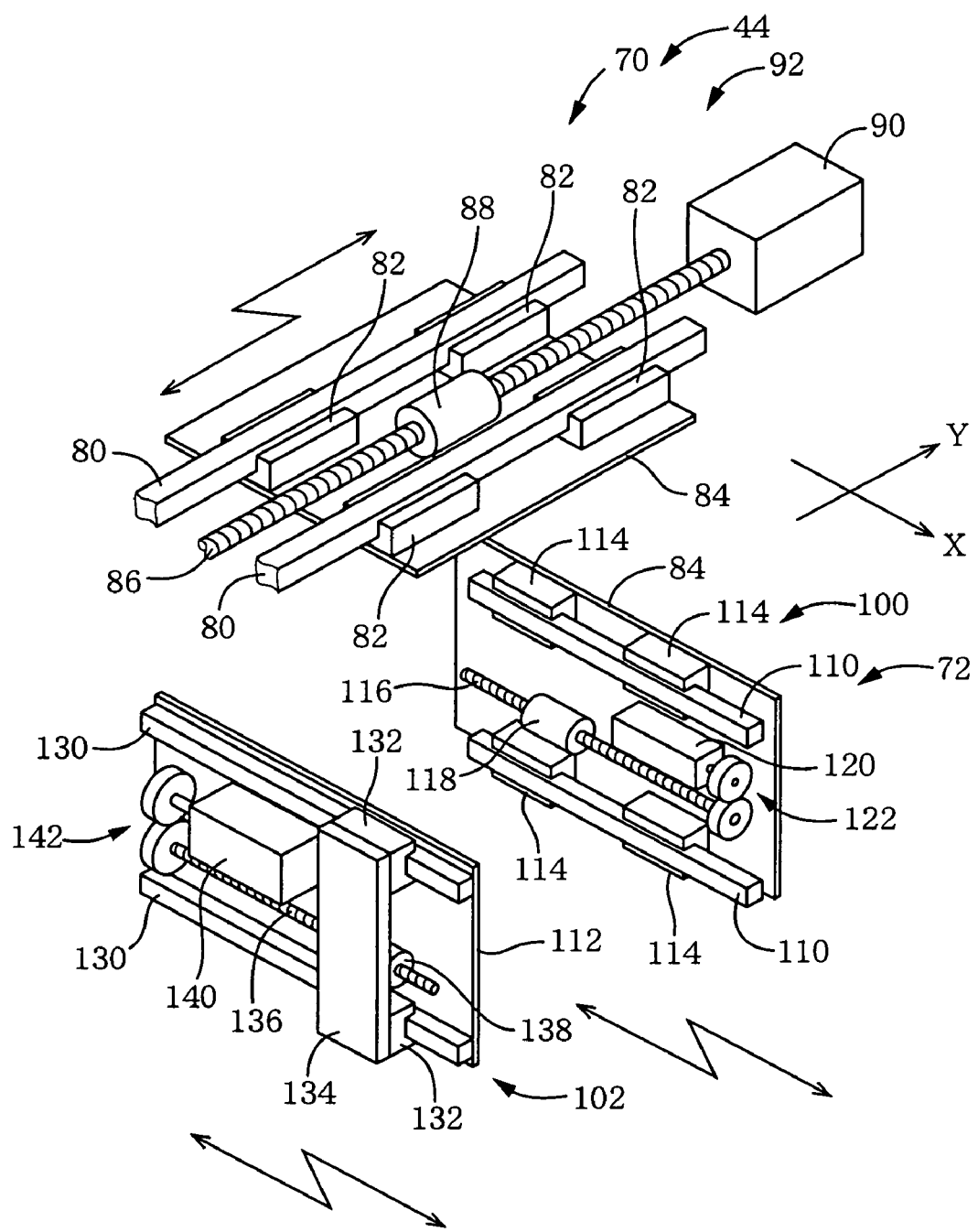
FIG. 5 is an illustrative perspective view of the head moving device.

FIG. 3 is a perspective view of the mounting head 40 and the head moving device 44. FIG. 4 is a cross-section view of an X slide device 72, described later, taken along a horizontal plane; and FIG. 5 is an illustrative perspective view of the head moving device 44 for easier understanding purposes. The head moving device 44 is so constructed as to include two linearly moving devices that move the mounting head 40 in two directions (i.e., the X-axis and Y-axis directions), respectively, that are perpendicular to each other. One of the two linearly moving devices is a Y slide device 70 that moves the mounting head 40 in the frontward and rearward directions (i.e., the Y-axis direction) that are horizontal directions perpendicular to the wiring-board conveying direction; and the other linearly moving device is an X slide device 72 that moves the head 40 in the leftward and rightward directions (i.e., the X-axis direction) that are parallel to the wiring-board conveying direction. The two linearly moving devices cooperate with each other to move the mounting head 40 along a horizontal plane. Thus, each of the mounting modules 12 is of a type wherein an operation performing head is moved along a reference plane.

The Y slide device 70 includes two Y-axis-direction guides (hereinafter, abbreviated to the "Y guides") 80 that are supported by the beam portion 16 such that the two Y guides 80 extend parallel to the Y-axis direction; a Y-axis slide 84 that has four sliding members (i.e., linear bearings) 82 sliding on the Y guides 80, and is movable in the Y-axis direction; a Y ball screw 86 that is supported by the beam portion 16 and extends in the Y-axis direction; a Y nut 88 that is supported by the Y-axis slide 84 such that the Y nut 88 is threadedly engaged with the Y ball screw 86, is rotatable, and is fixed in position; and a Y-axis drive device 92 including, as a drive source thereof, a Y-axis motor 90 as an electric motor (i.e., a servomotor with an encoder) that rotates the Y ball screw 86.

The X slide device 72 is a plural-step moving device, i.e., a two-step moving device, and includes two slide devices, i.e., a first X slide device 100 and a second X slide device 102 that move the mounting head 40 in respective directions parallel to each other. The first X slide device 100 includes a first X slide 112 having two first X-axis-direction guides (hereinafter, abbreviated to the "X1 guides") 110 that extend parallel to the X-axis direction; four sliding members (i.e., linear bearings) 114 that are fixedly supported by the Y-axis slide 84 and allow the X1 guides 110 to slide; an X1 ball screw 116 that is supported by the Y-axis slide 84 and extends in the X-axis direction; an X1 nut 118 that is supported by the first X slide 112 such that the X1 nut 118 is threadedly engaged with the X1 ball screw 116, is rotatable, and is fixed in position; and an X1 drive device 122 that is supported by the Y-axis slide 84 and includes, as a drive source thereof, an X1 motor 120 as an electric motor (i.e., a servomotor with an encoder) that rotates the X1 ball screw 116. The second X slide device 102 includes two second X-axis-direction guides (hereinafter, abbreviated to the "X2 guides") 130 that are supported by the first X slide 112 and extend parallel to the X-axis direction; a second X slide 134 having two sliding members (i.e., linear bearings) 132 that slide on the two X2 guides 130, respectively; an X2 ball screw 136 that is supported by the first X slide 112 and extends in the X-axis direction; an X2 nut 138 that is supported by the second X slide 134 such that the X2 nut 138 is threadedly engaged with the X2 ball screw 136, is rotatable, and is fixed in position; and an X2 drive device 142 that is supported by the X1 slide 112 and includes, as a drive source thereof, an X2 motor 140 as an electric motor (i.e., a servomotor with an encoder) that rotates the X2 ball screw 136.

The X-axis slide device 72 is the plural-step or two-step linearly moving device constructed as described above. Since the Y-axis slide 84 has the sliding members 114 that allow the X1 guides 110 to slide, the Y-axis slide 84 functions as a first track defining portion that defines a first track; since the first X slide 112 has the X2 guides 130, the first X slide 112 functions as a second track defining portion that defines a second track that is movable along the first truck and is parallel to the same; and since the second X slide 134 is movable along the X2 guides 130, the second X slide 134 functions as a movable portion that is movable along the second track. Thus, the X-axis slide device 72 is a telescopic-type moving device. The mounting head 40 is held by the second X slide 134 as the movable portion. Assuming that a direction in which the mounting head 40 is moved by the plural-step moving device is a specific direction, the X-axis direction corresponds to the specific direction, in each mounting module 12. While the respective rotations of the Y-axis motor 90, the X1 motor 120, and the X2 motor 140 are controlled, the mounting head 40 is moved along the reference plane, and is stopped at an arbitrary position in an operation performing area.

Figure 6:
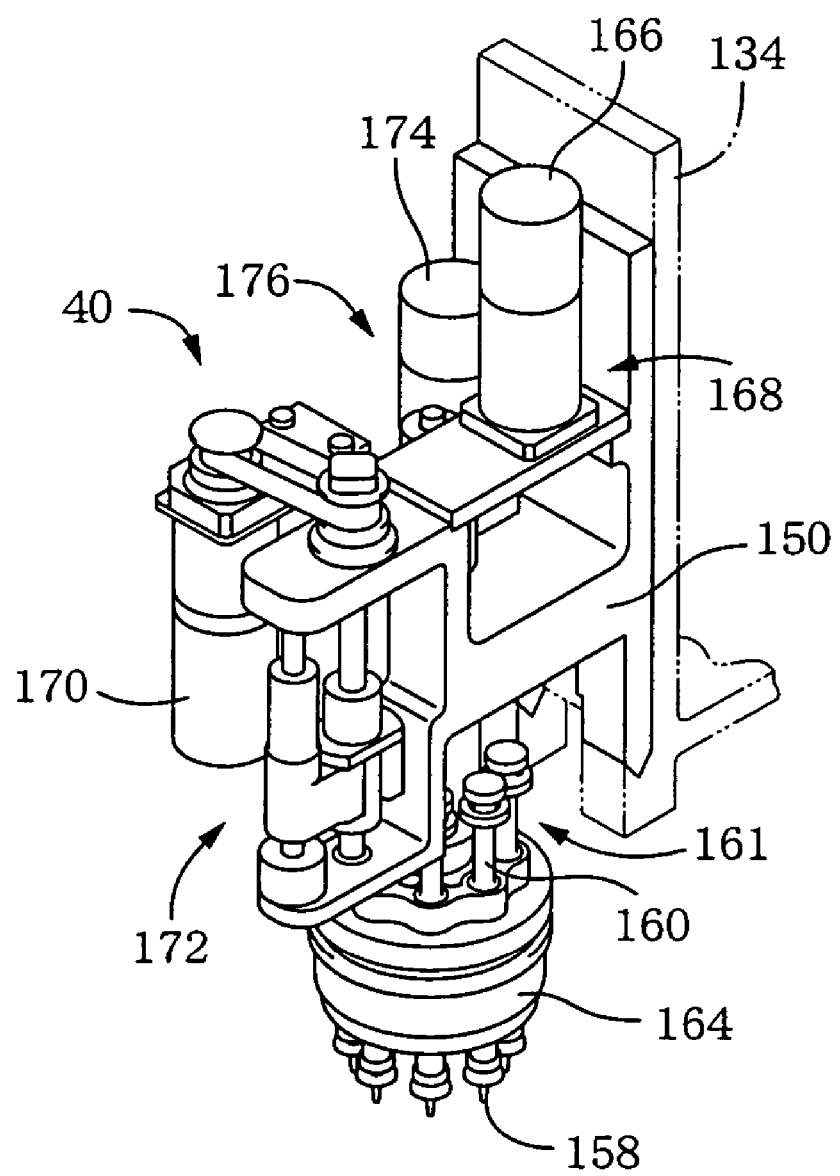
FIG. 6 is a perspective view of the mounting head of the mounting module.

FIG. 6 is a perspective view of the mounting head 40. The mounting head 40, held by the second X slide 134, includes a main body 150, various sorts of constituent elements and constituent devices that are provided at respective locations on the main body 150, and a head cover 152 (see FIG. 3) that covers the constituent elements and devices. FIG. 6 shows a state in which the head cover 152 is removed. The main body 150 can be quickly attached to, and detached from, the second X slide 134. In addition to the mounting head 40 shown in FIG. 6, various sorts of mounting heads, not shown, are prepared each of which can be selectively attached to the second X slide 134. A first one of those mounting heads includes a single nozzle holder that holds and mounts a large-size component 25. A second one of the mounting heads is disclosed by Japanese Patent Application Publication No. 6-342998, i.e., includes a support member that is rotatable about a vertical axis line; a main holder that is supported by the support member such that the main holder is rotatable about a horizontal axis line; and a plurality of nozzle holders that are supported by the main holder such that the nozzle holders extend in different radial directions of the main holder, respectively. In the second mounting head, one of respective suction nozzles held by the nozzle holders is positioned at an operative position where the one suction nozzle is oriented in a vertically downward direction so as to hold a component 25. Depending upon the sort of the mounting head 40 attached to each mounting module 12, a nozzle stocker 330, described later, and/or the component supplying device (of either the feeder type 24 or the tray type) is exchanged. Thus, each mounting module 12 is operable in each of a plurality of component mounting modes, e.g., a small-size-component mounting mode, a medium-size-component mounting mode, and a large-size-component mounting mode.

The mounting head 40, shown in FIG. 6, includes a plurality of (e.g., eight) nozzle holders 160 having respective lower end portions that hold respective suction nozzles 158 each as a component holder. Hereinafter, each nozzle holder 160 holding a suction nozzle 158 will be referred to as the "nozzle-holding holder 161". Each of the suction nozzles 158 communicates, via a negative-pressure-air passage and a positive-pressure-air passage, not shown, with a positive-pressure-and-negative-pressure selective supply device 162 (see FIG. 17), and utilizes a negative pressure to hold, by suction, a component 25, and a positive pressure to release the component 25. Each of the nozzle holders 160 has a generally bar-like shape, and constitutes a head-side nozzle-holding portion. The nozzle holders 160 are held by an outer portion of a rotatable body 164, such that the nozzle holders 160 are equiangularly spaced from each other and respective axis lines of the holders 160 extend in a vertical direction. Each of the nozzle holders 160 is rotatable about the axis line thereof, and is movable in directions parallel to the axis line. The rotatable body 164 is intermittently rotated by a rotating device 168 including a rotatable-body rotating motor 166 as an electric motor (e.g., a servomotor with an encoder), at a predetermined angular pitch equal to a predetermined angular pitch at which the nozzle holders 160 are equiangularly spaced from each other, so that each of the eight nozzle-holding holders 161 is intermittently revolved while being temporarily stopped at each of eight stop stations. The eight stop stations include a holder elevating and lowering station that is the most front station located on the side of the component supplying device 24 in the Y-axis direction. When each of the nozzle-holding holders 161 is positioned at the holder elevating and lowering station, the each holder 161 is lowered and elevated by a holder elevating and lowering device 172 including, as a drive source thereof, a holder elevating and lowering motor 170 as an electric motor (e.g., a servomotor with an encoder). The nozzle-holding holder 161 being positioned at the holder elevating and lowering station takes a component 25 from the component supplying device 24, and mounts the component 25 on the wiring board 30 held by the wiring-board conveying device 34. To this end, the nozzle-holding holder 161 is lowered by a pre-set distance. In addition, each of the nozzle holders 160 is rotated by a holder rotating device 176 including, as a drive source thereof, a holder rotating motor 174 as an electric motor (e.g., a servomotor with an encoder), for the purpose of, e.g., adjusting an angular position at which the component 25 held by the each holder 160 is to be mounted on the wiring board 30. The holder rotating device 176 is so constructed as to rotate simultaneously all the nozzle holders 160. The mounting head 40 is essentially constructed as described above. The second X slide 134 additionally supports, in a lower portion thereof, a mark-image taking device 178 (see FIG. 3) that takes, e.g., respective images of fiducial marks affixed to a surface (i.e., an upper surface) of the wiring board 30 and includes a CCD (charge-coupled device) camera.

Figure 7:
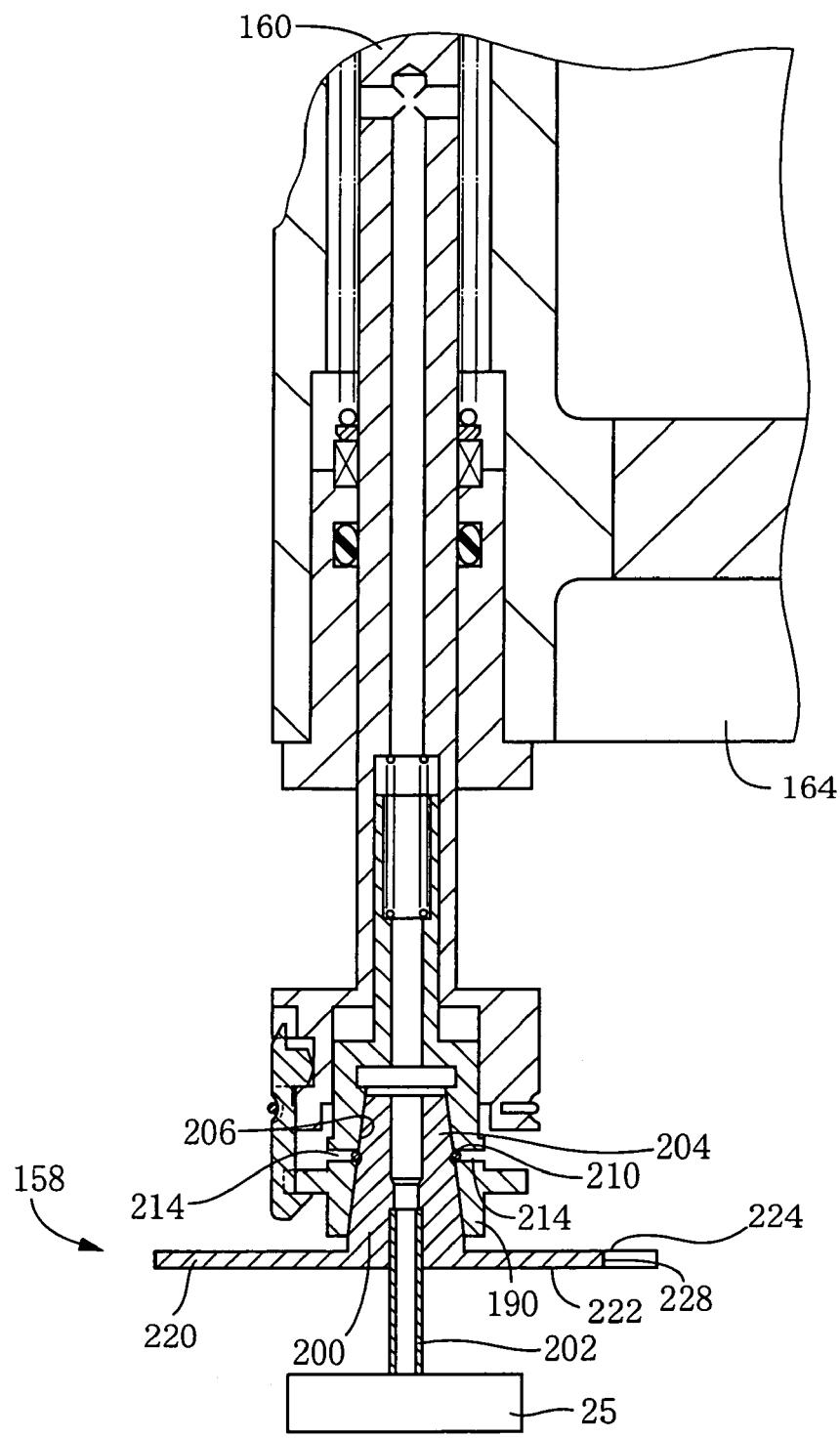
FIG. 7 is a front cross-section view of a portion of the mounting head.

As shown in FIG. 7, the suction nozzle 158 is held by the nozzle holder 160 such that the nozzle 158 is detachable from the holder 160. An attaching device that detachably attaches the suction nozzle 158 to the nozzle holder 160 is disclosed by, e.g., Japanese Patent Application Publication No. 11-220294. That is, based on a relative movement between the nozzle holder 160 and the suction nozzle 158 held by a nozzle storing device (described later) in a direction parallel to an axis line of the nozzle holder 160, the suction nozzle 158 is mechanically held by the nozzle holder 160, or released from the same 160. The suction nozzle 158 is attached to the nozzle holder 160 via a nozzle chuck 190. The nozzle chuck 190 is detachably attached to the lower end portion of the nozzle holder 160.

The suction nozzle 158 includes a suction-pipe holder 200, and a suction pipe 202 that is held by the suction-pipe holder 200. The suction pipe holder 200 includes a tapered portion 204 as a fitting projection that fits in a tapered hole 206 as a fitting hole as a sort of fitting recess that is provided in the nozzle chuck 190. A spring member 210 as a sort of biasing device attaches the suction nozzle 158 to the nozzle chuck 190. The spring member 210 has a generally U-shaped configuration including two arm portions that fit in two recesses 214, respectively, that are formed in the nozzle chuck 190. A distance between the two arm portions of the spring member 210 decreases in a direction toward respective free end portions of the arm portions. Thus, the spring member 210 can effectively fasten the suction nozzle 158 to the nozzle chuck 190. Since the respective free end portions of the two arm portions of the spring member 210 are bent toward each other, the spring member 210 is effectively prevented from coming off the nozzle chuck 190. The suction-pipe holder 200 additionally includes a disc-like background forming portion 220 whose lower surface 222 (from which the suction pipe 202 projects) provides a light emitting surface. The light emitting surface may be either a reflecting surface that reflects a light, a fluorescent surface that absorbs an ultraviolet light and emits a visible light, or a dark surface such as a black surface.

Figure 8:
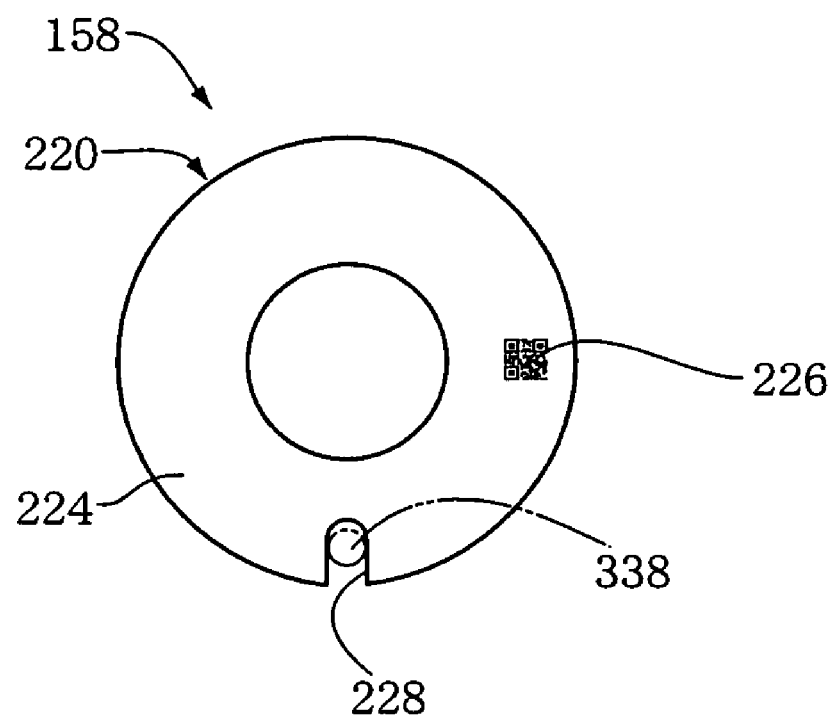
FIG. 8 is a plan view of a suction nozzle of the mounting head.

As shown in FIG. 8, the background forming portion 220 of the suction-pipe holder 200 of each of the suction nozzles 158 has, on an upper surface 224 thereof, a two-dimensional code (so-called "two-dimensional bar code" or "QR code") 226 that identifies the each suction nozzle 158 from each of the other suction nozzles 158. The two-dimensional code 226 is a sort of identification-code recording portion where an identification code that represents a specific sort, an individual code number, etc. of the each suction nozzle 158 is recorded. The two-dimensional code 226 may be replaced with a bar code. The background forming portion 220 additionally has an engaging recess 228 that is formed in an outer peripheral portion thereof such that the engaging recess 228 has a predetermined angular phase relative to the two-dimensional code 226. In the embodiment shown in FIG. 8, the engaging recess 228 is angularly distant by 90 degrees from the two-dimensional code 226.

Figure 9:
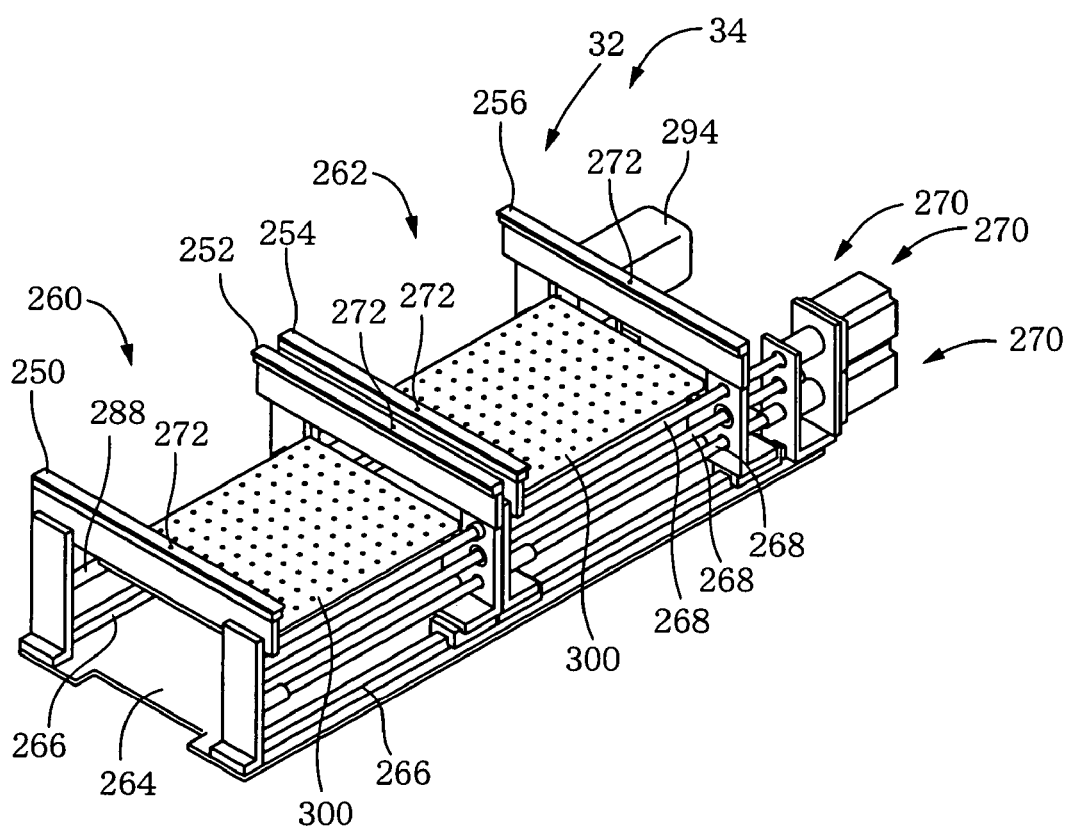
FIG. 9 is a perspective view of a general arrangement of a wiring-board conveying device that is employed by the mounting module.

FIG. 9 shows an entirety of the wiring-board conveying device 34 as a substrate conveyor. The wiring-board conveying device 34 includes four conveyor rails (hereinafter, abbreviated to the "rails") 250, 252, 254, 256 that extend parallel to each other in the wiring-board conveying direction (i.e., the leftward and rightward directions). The most front rail 250 (i.e., the rail 250 nearest to the component supplying device 24) is opposed to the rail 252 in rear of the rail 250 so as to provide a pair of rails; and the rail 254 in rear of the rail 252 is opposed to the rail 256 in rear of the rail 254 so as to provide another pair of rails. Thus, the wiring-board conveying device 34 includes two conveyors, i.e., a front conveyor 260 including the rails 250, 252, and a rear conveyor 262 including the rails 254, 256. The rails 250, 252 function as a reference rail and a dependent rail of the front conveyor 260, respectively; and the rails 254, 256 function as a reference rail and a dependent rail of the rear conveyor 262, respectively.

The rail 250 is a stationary rail that is fixedly provided on a front end portion of a base 264 (i.e., on the side of the component supplying device 24 in the Y-axis direction); and the rails 252, 254, 256 are movable rails that are movable along two guide members 266 provided on the base 264, in the leftward and rightward directions. The wiring-board conveying device 34 has, in a right portion thereof, three ball screws 268 that are threadedly engaged with three nuts, respectively, that are fixed to the three movable rails 252, 254, 256, respectively, and additionally has, in a rear portion thereof, three rail-position changing motors 270 (one motor 270 is not shown) each as an electric motor (i.e., a stepper motor) as a drive source to drive a corresponding one of the three ball screws 268. The three rail-position changing motors 270 can be driven independent of each other, so as to move the three movable rails 252, 254, 256 independent of each other in the frontward and rearward directions (i.e., the Y-axis direction). Thus, a width of each of the front conveyor 260 and the rear conveyor 262 can be freely changed. Each of the four rails 250 through 256 has, at a middle position on an upper surface thereof, a fiducial mark 272 whose image is taken by the mark-image taking device 178 provided together with the mounting head 40 on the head moving device 44, so that a position of the each rail in the mounting module 12 is determined and, based on the thus determined position of the each rail, the width of each of the two conveyors 260, 262 is adjusted. Thus, the wiring-board conveying device 34 includes a width adjusting device that adjusts the width of each of the two conveyors 260, 262 according to a width (i.e., a dimension in a direction perpendicular to the wiring-board conveying direction) of the wiring board 30 to be conveyed by the each conveyor. The width adjusting device includes the movable rails 252, 254, 256 and the rail-position changing motors 270.

In the case where the wiring-board conveying device 34 conveys wiring boards 30 each having a small width, both the front and rear conveyors 260, 262 can be used. That is, the wiring-board conveying device 34 functions as a two-line conveying device. In this case, the rail 254 as the reference rail of the rear conveyor 262 is fixed at a predetermined position, and the respective widths of the two conveyors 260, 262 are adjusted. On the other hand, in the case where the wiring-board conveying device 34 conveys wiring boards 30 each having a large width, only one of the front and rear conveyors 260, 262 is used. That is, the wiring-board conveying device 34 functions as a one-line conveying device. In this case, the rail 254 is moved to the rear or front end of the conveying device 34 (in the Y-axis direction), and the width of the above-indicated one conveyor is adjusted.

A structure of the rail 252 as a representative of the four rails 250 through 256 will be described below by reference to FIGS. 10(a) and 10(b). FIG. 10(a) is a front view of the rail 252; and FIG. 10(b) is a cross-section view taken along A-A in FIG. 10(a). The rail 252 includes two brackets 280; a main plate 282 that bridges the two brackets 280; and a guide plate 284 that is provided on an upper surface of the main plate 282. One of the two brackets 280 supports a drive pulley 286. The wiring-board conveying device 34 has, in one end portion (i.e., the left end portion) thereof in the X-axis direction, a spline shaft 288 (see FIG. 9) that extends in the frontward and rearward directions (i.e., in the Y-axis direction). Although not shown in FIG. 10(a) or 10(b), the drive pulley 286 fits on the spline shaft 288 in a splined manner in which wherever the rail 252 may be positioned in the frontward and rearward directions, the rotation of the spline shaft 288 can be transmitted to the drive pulley 286. The two brackets 280 and the main plate 282 cooperate with each other to support a plurality of driven pulleys 290 such that each of the driven pulleys 290 is rotatable. A conveyor belt 292 is wound on the drive pulley 286 and the driven pulleys 290 in a manner shown in FIGS. 10(a) and 10(b). The spline shaft 288 is connected to a wiring-board conveying motor 294 (see FIG. 9) as an electric motor (i.e., a servomotor with an encoder) that is provided in a rear end portion of the conveying device 34. Thus, when the wiring-board conveying motor 294 is driven, the conveyor belt 292 is circulated. Since each of the other rails 250, 254, 256 has a construction identical with that of the rail 252, the description thereof is omitted.

While the wiring board 30 is supported by respective upper, horizontally stretched portions of the two conveyor belts 292, and is guided by the two guide members 284 so as to be positioned with respect to the frontward and rearward directions, the wiring board 30 is conveyed in the wiring-board conveying direction, i.e., the leftward and rightward directions (i.e., the X-axis direction), as the conveyor belts 292 are circulated. Since, however, the four conveyor belts 292 respectively associated with the four rails 250 through 256 are simultaneously circulated, the respective conveying operations of the front and rear conveyors 260, 262 cannot be controlled independent of each other.

Figure 14:
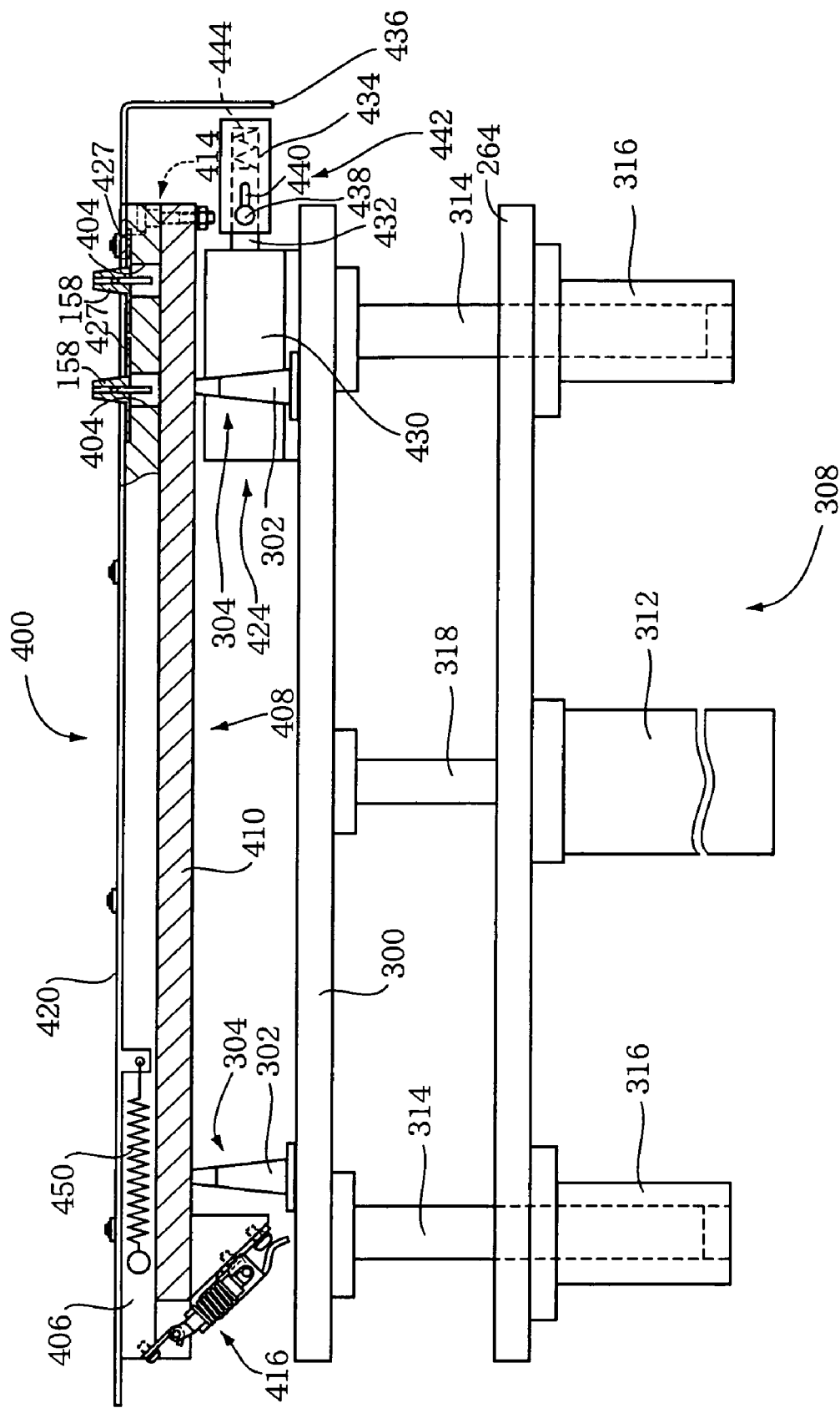
FIG. 14 is a front (partly cross-sectioned) view of a nozzle carrier plate and a wiring-board holding device that are employed by the electronic-circuit-component mounting system.

The wiring-board conveying device 34 also functions as the wiring-board holding device 32 that fixes and holds the wiring board 30 at the predetermined position where the component mounting operation is performed. To this end, the wiring-board conveying device 34 includes two support plates 300, and a plurality of backup devices 304 each of which includes a backup pin 302 as a support member and which are attachable to respective arbitrary positions on an upper surface of each of the two support plates 300. The wiring board 30 that has been conveyed while being supported by the two conveyor belts 292 is stopped at the predetermined position corresponding to the respective sorts of the wiring board 30 and the component mounting operation, when the circulation of the belts 292 is stopped. In this state, the corresponding support plate 300 is moved upward by a pre-set distance by a support-plate elevating and lowering device 308 (see FIG. 14), as indicated at two-dot chain lines in FIG. 10(a). Consequently respective upper ends of the backup pins 302 contact a lower surface of the wiring board 30, and the pins 302 lift up the board 30 off the belts 292, so that respective upper surfaces of widthwise opposite end portions of the board 30 are engaged, with an appropriate force, with respective engaging portions 310 of the two guide members 284. Thus, the wiring board 30 is fixed and held at the predetermined position where the component mounting operation is performed. As shown in FIG. 14, the support-plate elevating and lowering device 308 includes an air cylinder 312 as a hydraulically operated cylinder as a sort of drive source; a pair of guide rods 314, as a guide device, that cooperate with each other to guide the upward and downward movement of the support plate 300; and a pair of guide members 316. The air cylinder 312 and the guide members 316 are fixed to the base 264; an upper end of a piston rod 318 projecting upward from the air cylinder 312 is fixed to a lower surface of the support plate 300 that is opposite to the upper surface thereof on which the backup pins 302 are provided; and respective upper ends of the two guide rods 314 are fixed to the lower surface of the support plate 300.

Figure 17:
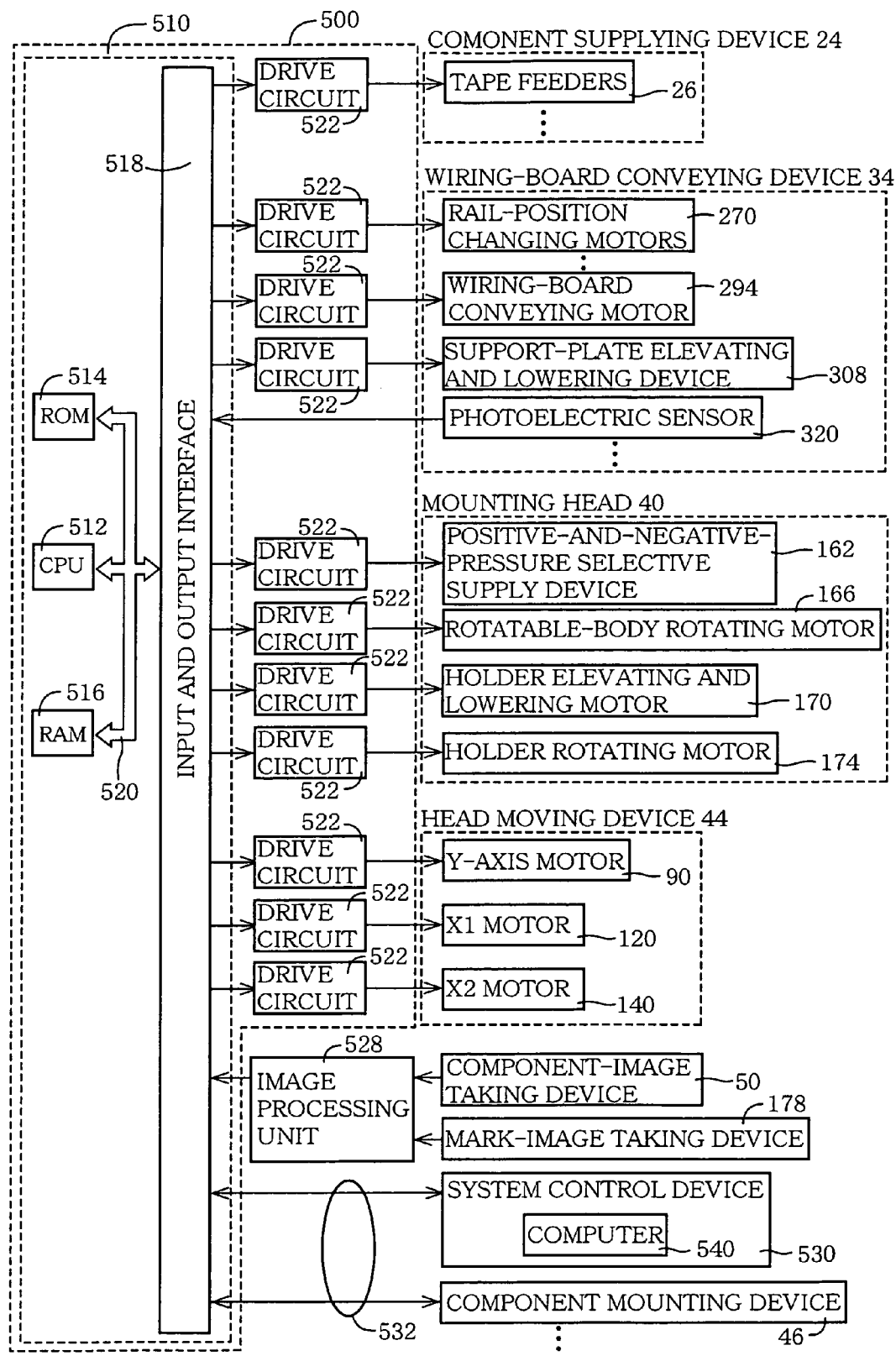
FIG. 17 is a diagrammatic view of a control device of the mounting module.

The starting and stopping of circulation of the conveyor belts 292 are controlled based on a detection signal supplied by a photoelectric sensor 320 (not shown in FIG. 9 or FIGS. 10(a) and 10(b); see FIG. 17) as a wiring-board detector as a sort of substrate detector that is associated with the wiring-board conveying device 34 of each mounting module 12, or the wiring-board conveying device 34 of the upstream or downstream mounting module 12 located on an upstream or downstream side of the each mounting module 12. As described above, the respective conveying operations of the front and rear conveyors 260, 262 of the wiring-board conveying device 34 cannot be controlled independent of each other. However, while one of the front and rear conveyors 260, 262 holds the wiring board 30, the other conveyor can perform the conveying operation. In this case, the two conveyors 260, 262 can be concurrently operated and accordingly a highly efficient, two-line operation can be performed.

Each mounting module 12 includes a nozzle stocker 330 as a nozzle storing device that stores one or more suction nozzles 158. As described above, there are prepared different sorts of mounting heads 40 corresponding to different sorts of components 25 to be mounted, and the different sorts of mounting heads 40 are used with different sorts and numbers of suction nozzles 158. Accordingly, there are prepared different sorts of nozzle stockers 330 that store the different sorts and numbers of suction nozzles 158 corresponding to the different sorts of mounting heads 40 or the different sorts of components 25 to be mounted. An appropriate one of the different sorts of nozzle stockers 330 is selected and attached to each mounting module 12, so that the suction nozzles 158 held by the one nozzle stocker 330 are exchanged with the suction nozzles 158 held by the mounting head 40 of the each mounting module 12. To this end, each mounting module 12 includes a stocker holding portion 334. Since the nozzle stocker 330 and the stocker holding portion 334 employed in the present embodiment have respective constructions identical with those of a nozzle storing device and a storing-device holding portion that are disclosed by Japanese Patent Application Publication No. 11-220294, those elements 330, 334 are briefly described below.

Figure 11:
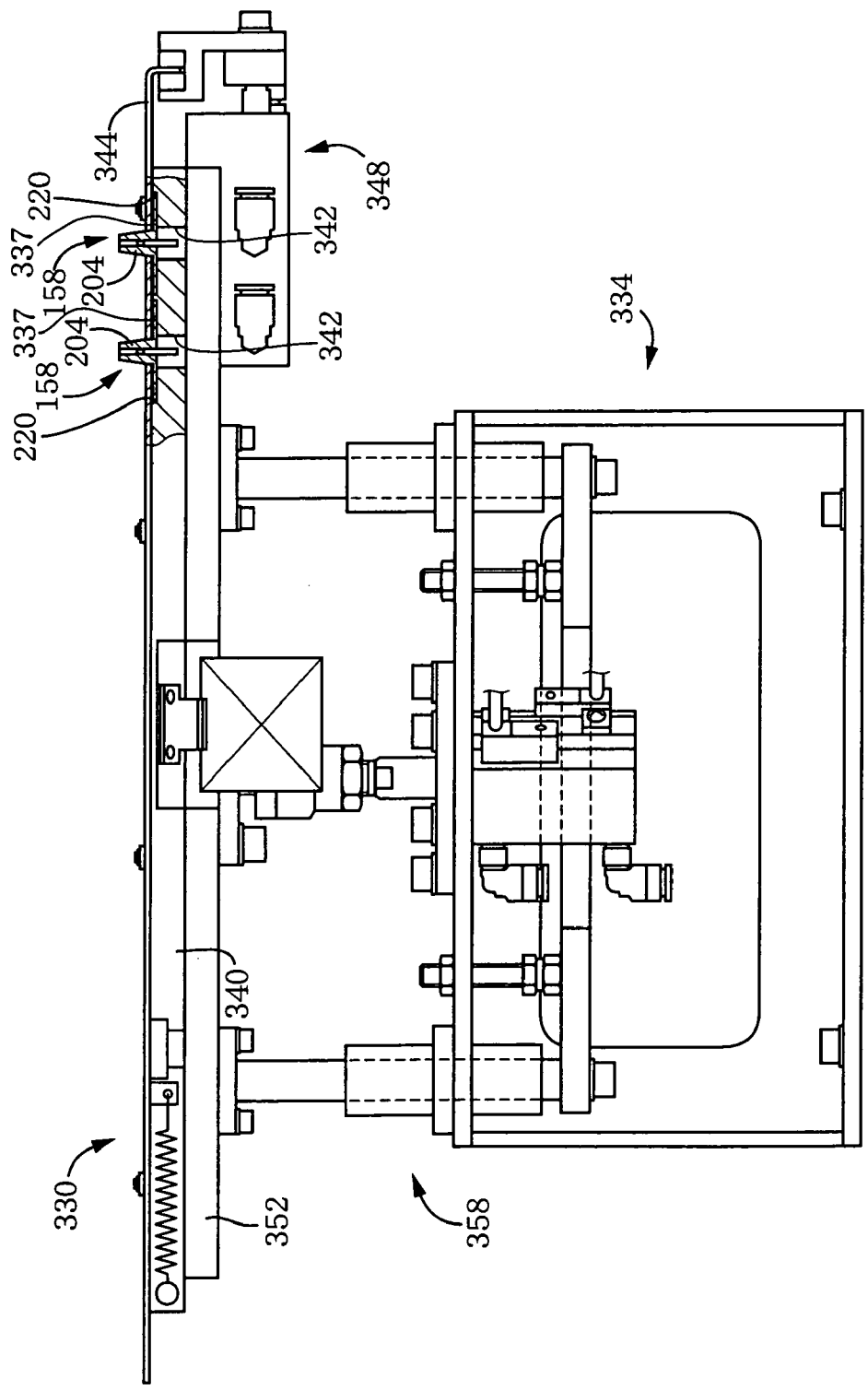
FIG. 11 is a front (partly cross-sectioned) view of a nozzle storing device and a storing-device holding portion that are employed by the mounting module.
Figure 12:
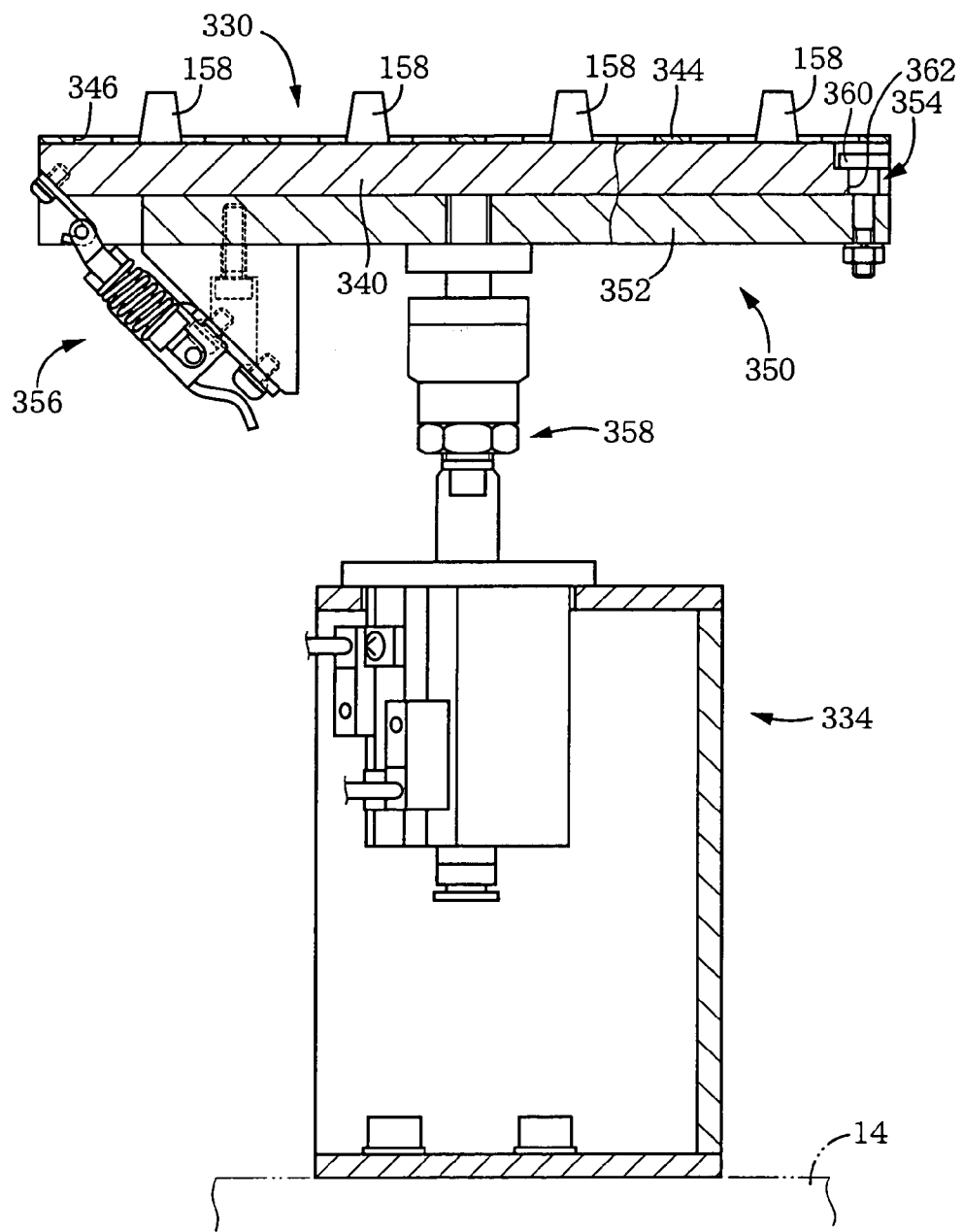
FIG. 12 is a side (partly cross-sectioned) view of the nozzle storing device and the storing-device holding portion.
Figure 13:
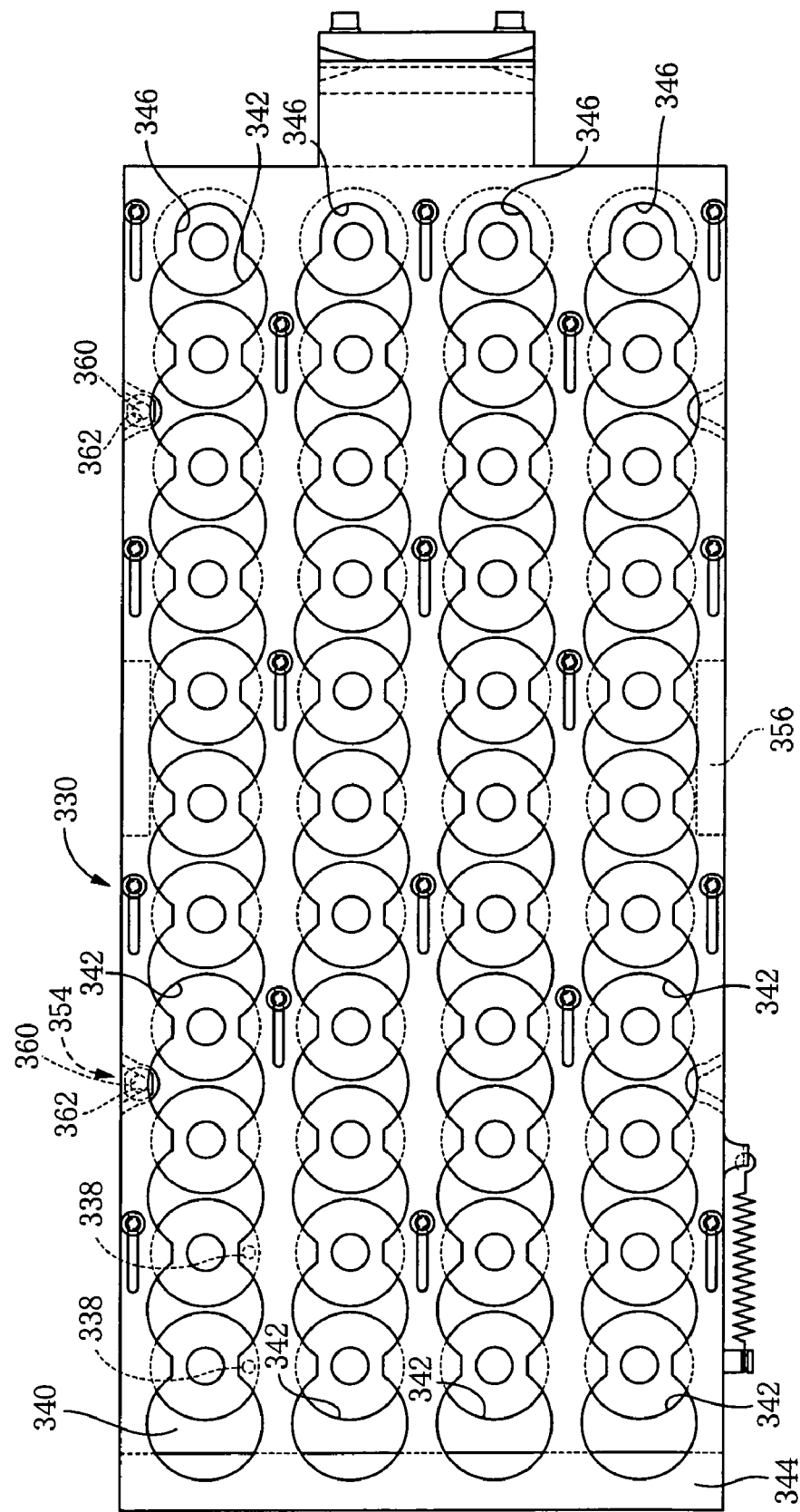
FIG. 13 is a plan view of the nozzle storing device.

As shown in FIGS. 11 through 13, the nozzle stocker 330 includes a nozzle holding member 340. The nozzle holding member 340 has a plurality of nozzle holding holes 342 each of which can hold one suction nozzle 158. Each of the nozzle holding holes 342 is a stepped hole including a large-diameter portion that can accommodate the background forming portion 220 of each suction nozzle 158; a small-diameter portion that can accommodate the suction pipe 202 of the each suction nozzle 158; and a shoulder surface 337 which is located between the large-diameter portion and the small-diameter portion and from which a positioning pin 338 as a positioning projection projects upward (only the respective pins 338 of two holes 342 are shown in FIG. 13). A length of projection of the positioning pin 338 is somewhat smaller than a depth of the large-diameter portion of each nozzle holding hole 342. When each suction nozzle 158 is accommodated by one nozzle holding hole 342, the engaging portion 228 of the each nozzle 158 is engaged with the positioning pin 338 of the one hole 342 (see FIG. 8), and the each nozzle 158 is prevented from being rotated relative to the one hole 342. Thus, each suction nozzle 158 is stored by the nozzle stocker 330 such that the each nozzle 158 takes a predetermined angular position relative to the stocker 330.

The nozzle stocker 330 additionally includes a coming-off preventing member 344 that is movable relative to the nozzle holding member 340. The coming-off preventing member 344 has a plate-like shape, and has a plurality of openings 346 corresponding to the nozzle holding holes 342, respectively. When the coming-off preventing member 344 is moved, by a preventing-member moving device 348, in a direction parallel to a surface of the preventing member 344, the preventing member 344 can be selectively moved to an operative position thereof in which the preventing member 344 covers respective upper openings of the nozzle holding holes 342 and thereby prevents the suction nozzles 158 from coming off the holes 342, and to an inoperative position thereof in which the preventing member 344 opens the respective upper openings of the holes 342 and thereby allows the nozzles 158 to be taken from the holes 342.

As shown in FIG. 12, the stocker holding portion 334 is supported by the frame portion 14. The stocker holding portion 334 includes a holding-member holding device 350 that holds the nozzle holding member 340 and includes a holding-member support table 352. The stocker holding portion 334 additionally includes a positioning device 354 that is supported by the support table 352 and positions the nozzle holding member 340 relative to the table 352; a known fastener 356 as a fixing device that is also supported by the table 352 and fastens the nozzle holding member 340 to the table 352; and an elevating and lowering device 358 that elevates and lowers the table 352. The positioning device 354 includes two pins 360 that include respective head portions and are fixed to the support table 352 such that the two pins 360 are spaced from each other in a direction parallel to one side of the table 352; and two engaging recesses 362 that are formed through a thickness of the nozzle holding member 340. When the two engaging recesses 362 of the nozzle holding member 340 are engaged with the two pins 360, respectively, the nozzle holding member 340 is positioned relative to the support table 352. In this state, an operator manually operates the fastener 356 to fasten the nozzle holding member 340 to the support table 352.

The mounting head 40 is moved to a position above the nozzle holding member 340 and, owing to the upward and downward movement of each nozzle holder 160 and the upward and downward movement of the holding-member support table 352, the each nozzle holder 160 holds one suction nozzle 158 held by the nozzle holding member 340, or returns one suction nozzle 158 held thereby, to the nozzle holding member 340.

An appropriate one of the nozzle stockers 330 is selectively attached to the holding-member holding device 350 as a storing-device holding device. The one nozzle stocker 330 is attached to the holding-member holding device 350 in such a manner that first the nozzle holding member 340 is placed on the holding-member support table 352 while being positioned by the positioning device 354, and then is fastened to the support table 352 by the fastener 356. In addition, the nozzle stocker 330 is detached from the stocker holding portion 334 in such a manner that first the nozzle holding member 340 is released from the fastener 356, and then is removed off the holding-member support table 352. The coming-off preventing member 344 can prevent the suction nozzles 158 from coming off the nozzle holding member 340, also when the nozzle stocker 330 is conveyed.

There are prepared different sorts of nozzle stockers 330 including different sorts of nozzle holding members 340 that have different sizes and/or capacities corresponding to different sorts and numbers of suction nozzles 158 to be stored thereby, and an appropriate one of the nozzle stockers 330 is selectively attached to the stocker holding portion 334. Each of the mounting modules 12 employs at least one stocker holding portion 334. For example, in the case where each mounting module 12 employs a plurality of stocker holding portions 334, those stocker holding portions 334 may be either identical ones, or ones having different sizes corresponding to nozzle stockers 330 having different sizes.

The nozzle holding member 340 is adapted to be able to hold one or more specific sorts, and a specific number, of suction nozzles 158 that correspond to a specific sort of mounting head 40 (i.e., a specific sort of wiring board 30 on which components 25 are to be mounted by the head 40). For example, when a current sort of wiring boards 30 are changed to a new sort of wiring boards 30, it is needed to exchange one or more suction nozzles 158 held by the mounting head 40. In the present embodiment, one or more suction nozzles 158 is or are exchanged between the nozzle stocker 330, and a nozzle carrier plate 400 that holds one or more suction nozzles 158 of different sort or sorts than that or those of the suction nozzle or nozzles 158 held by the mounting head 40. In the present embodiment, the mounting head 40 is used to exchange the suction nozzle or nozzles 158.

Figure 15:
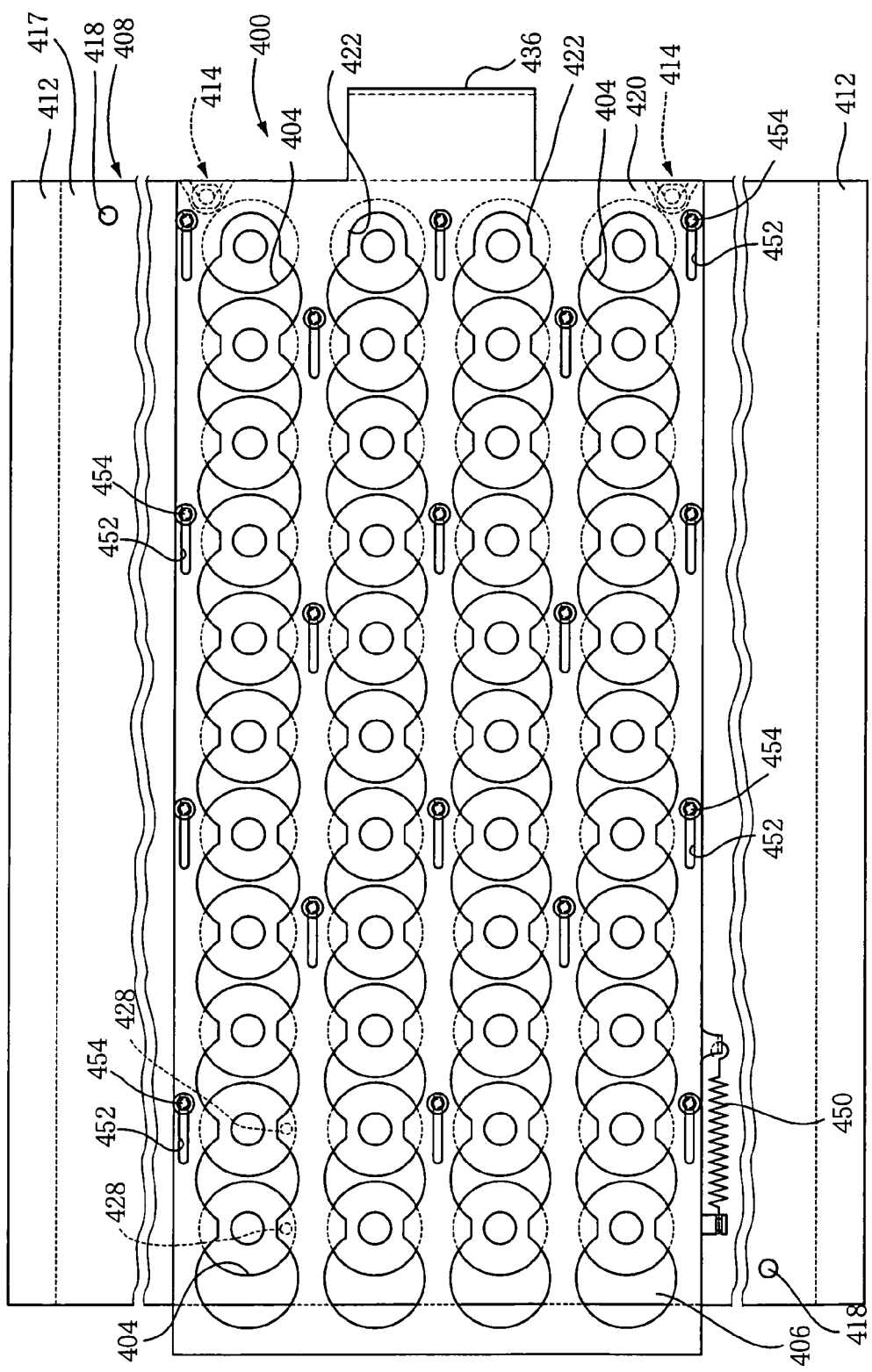
FIG. 15 is a plan view of the nozzle carrier plate.
Figure 16:
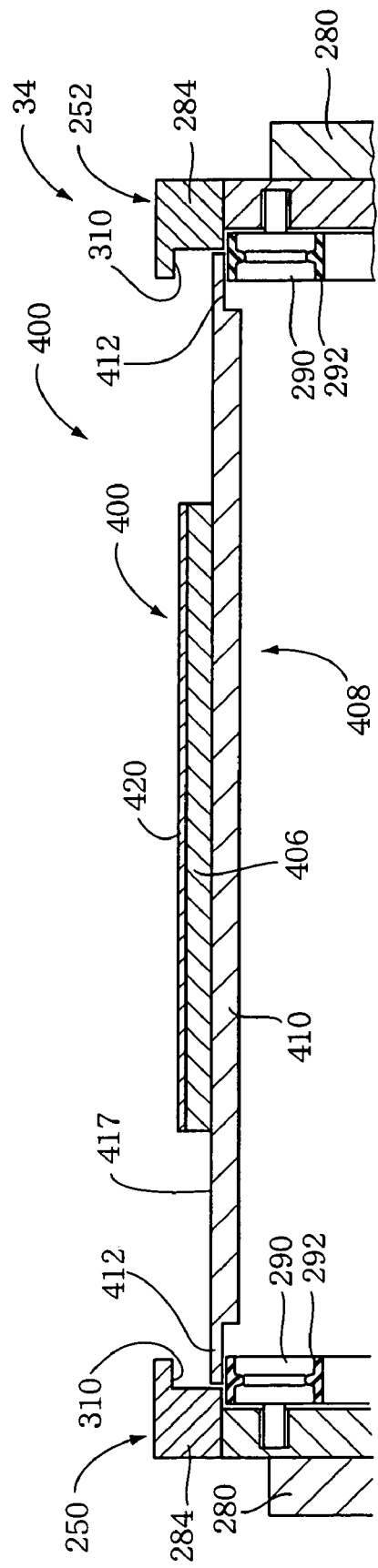
FIG. 16 is a side cross-sectioned view of the nozzle carrier plate and the wiring-board conveying device.

As shown in FIGS. 14 through 16, the nozzle carrier plate 400 includes a nozzle holding member 406 having a plurality of nozzle holding holes 404 that can hold a plurality of suction nozzles 158, respectively; and a holding-member holding device 408 that holds the nozzle holding member 406. The holding-member holding device 408 includes a plate-like support table 410 that supports the nozzle holding member 406. The support table 410 has, in opposite side portions thereof corresponding to the two rails 250, 252 (or 254, 256), two contact portions 412 that are supported by the respective upper, horizontally stretched portions of the two conveyor belts 292, like the wiring board 30. When the support table 410 is supported and conveyed by the wiring-board conveying device 34 and is held by the wiring-board holding device 32, the nozzle carrier plate 400 is conveyed and held. The holding-member holding device 408 additionally includes a positioning device 414 that positions the nozzle holding member 406 relative to the support table 410; and a fastener 416 as a fixing device that fastens the nozzle holding member 406 to the support table 410. The positioning device 414 and the fastener 416 have respective constructions identical with those of the positioning device 354 and the fastener 356. A support surface 417 of the support table 410 that supports the nozzle holding member 406 has a plurality of fiducial marks 418 affixed thereto. In the example shown in FIG. 15, two fiducial marks 418 are provided at respective positions that are remote from each other on a diagonal line of the support surface 417.

The nozzle carrier plate 400 has basically same construction and function as those of the nozzle stocker 330. The nozzle carrier plate 400 additionally includes a coming-off preventing member 420 that has a construction identical with the coming-off preventing member 344 and is movable relative to the nozzle holding member 406. The coming-off preventing member 420 has a plate-like shape, and has a plurality of openings 422 corresponding to the nozzle holding holes 404 of the nozzle holding member 406, respectively. When the coming-off preventing member 420 is moved, by a preventing-member moving device 424, in a direction parallel to a surface of the preventing member 420, the preventing member 420 can be selectively moved to an operative position thereof in which the preventing member 420 covers respective upper openings of the nozzle holding holes 404 and thereby prevents the suction nozzles 158 from coming off the holes 404, and to an inoperative position thereof in which the preventing member 420 opens the respective upper openings of the holes 404 and thereby allows the nozzles 158 to be taken from the holes 404. Like each nozzle holding hole 342, each nozzle holding hole 404 is a stepped hole including a large-diameter portion that can accommodate the background forming portion 220 of each suction nozzle 158; a small-diameter portion that can accommodate the suction pipe 202 of the each suction nozzle 158; and a shoulder surface 427 which is located between the large-diameter portion and the small-diameter portion and from which a positioning pin 428 as a positioning projection projects upward (only the respective pins 428 of two holes 404 are shown in FIG. 15). When each suction nozzle 158 is accommodated by one nozzle holding hole 404, the engaging portion 228 of the each nozzle 158 is engaged with the positioning pin 428 of the one hole 404, and the each nozzle 158 is prevented from being rotated relative to the one hole 404. Thus, each suction nozzle 158 is stored by the nozzle carrier plate 400 such that the each nozzle 158 takes a predetermined angular position relative to the plate 400.

The preventing-member moving device 424 includes an air cylinder 430 as a sort of hydraulically operated cylinder as a drive source. The air cylinder 430 is fixed to the support plate 300. The air cylinder 430 includes a piston rod 432 whose end portion supports an engaging member 434, and the coming-off preventing member 420 includes an engaging portion 436 extending downward. The engaging member 434 is a generally cylindrical, tubular member including a bottom wall, and fits on the end portion of the piston rod 432 such that the engaging member 434 is slideable relative to the piston rod 432. The engaging member 434 is movable relative to the piston rod 432 within a permission range that is defined by a permission-range defining device 442 including a pin 438 fixed to the piston rod 432; and an elongate hole 440 formed through a thickness of the engaging member 434. A compression coil spring 444 as an elastic member is provided between the piston rod 432 and the engaging member 434, and biases the engaging member 434 in a direction to move the engaging member 434 away from the piston rod 432.

While the nozzle carrier plate 400 is conveyed by the wiring-board conveying device 34, the support plate 300 constituting a portion of the wiring-board holding device 32 is kept at a lower-end position (i.e., a retracted position) by the support-plate elevating and lowering device 308. Thus, the preventing-member moving device 424 and the backup pins 302 are prevented from interfering with the engaging portion 436 of the coming-off preventing member 420, and the fastener 416. After the nozzle carrier plate 400 is stopped at the predetermined position in the mounting module 12, the support plate 300 is moved upward to an upper-end position by the elevating and lowering device 308, so that the engaging member 434 of the preventing-member moving device 424 is opposed to the engaging portion 436 of the coming-off preventing member 420, at a position remote by a small distance from the engaging portion 436.

In this state, the piston rod 432 of the air cylinder 430 is extended so that the engaging member 434 engages the engaging portion 436. Consequently the coming-off preventing member 420 is moved, relative to the nozzle holding member 406, to the inoperative position against a biasing force of a tension coil spring 450 as a spring member as a sort of biasing device. Though the piston rod 432 may be further extended a small distance, this additional extension of the piston rod 432 can be absorbed by a movement of the engaging member 434 relative to the piston rod 432 against the biasing force of the compression coil spring 444. On the other hand, if the piston rod 432 is retracted into the air cylinder 430, the coming-off preventing member 420 is moved, relative to the nozzle holding member 406, to the operative position owing to the biasing force of the tension coil spring 450. Though the piston rod 432 may be further extended a small distance, this additional extension of the piston rod 432 can be absorbed by a movement of the engaging member 434 relative to the piston rod 432 against the biasing force of the compression coil spring 444. A range of movement of the coming-off preventing member 420 between the operative and inoperative positions thereof is defined by engagement of a plurality of elongate holes 452 formed through a thickness of the preventing member 420, with a plurality of pins 454 projecting upward from the nozzle holding member 406. The elongate holes 452 and the pins 454 cooperate with each other to function as a movement-range defining device, and additionally function as not only a guiding device that guides the movement of the coming-off preventing member 420 relative to the nozzle holding member 406 but also a rotation preventing device that prevents the preventing member 420 from being rotated in a plane parallel to the nozzle holding member 406. The coming-off preventing member 420 can prevent the suction nozzles 158 from coming off the nozzle holding member 406, also when the nozzle carrier plate 400 is conveyed.

There are prepared different sorts of nozzle carrier plates 400 including different sorts of nozzle holding members 406 that have different sizes and/or capacities corresponding to different sorts and numbers of suction nozzles 158 to be held thereby. The support table 410 has such a size that assures that the table 410 can be used with each of the different sorts of nozzle carrier plates 400.

When one or more suction nozzles 158 is or are exchanged between the nozzle stocker 330 and the nozzle carrier plate 400, the mounting head 40 is moved to a position above the nozzle holding member 406 of the nozzle carrier plate 400 and, owing to the upward and downward movement of each nozzle holder 160 and the upward and downward movement of the support plate 300, the each nozzle holder 160 returns one suction nozzle 158 held thereby, to the nozzle holding member 406, or holds one suction nozzle 158 held by the nozzle holding member 406.

FIG. 17 is a diagrammatic view of a control portion of each mounting module 12 that is relevant to the present invention. The present mounting system includes the plurality of mounting modules 12 each of which employs the mounting-module control device 500. FIG. 17 shows the diagrammatic view of the control device 500 of one of the mounting modules 12 and the various devices of the one mounting module 12 that are associated with the control device 500. The mounting-module control device 500 is essentially constituted by a computer 510, and the computer 510 includes a CPU 512, a ROM 514, a RAM 516, an input and output interface 518, and a bus 520 that couples those elements 512, 514, 516, 518 to each other. The control device 500 additionally includes respective drive circuits 522 via which the input and output interface 518 is connected to the tape feeders 26 of the component supplying device 24; the three rail-position changing motors 270, wiring-board conveying motor 294, and support-plate elevating and lowering device 308 of the wiring-board conveying device 34; the positive-and-negative-pressure selective supply device 162, rotatable-body rotating motor 166, holder elevating and lowering motor 170, and holder rotating motor 174 of the mounting head 40; and the Y-axis motor 90, X1 motor 120, and X2 motor 140 of the head moving device 44. In addition, the component-image taking device 50 and the mark-image taking device 178 are connected to the input and output interface 518 via an image processing unit 528 that processes image data representing the images taken by those image taking devices 50, 178 and obtains various results from the image data. Moreover, the photoelectric sensor 320 of the wiring-board conveying device 34 is connected to the input and output interface 518.

Each one of the mounting modules 12 is operated in relation with the respective operations of the other mounting modules 12. To this end, the present basic system includes a system control device 530 (not shown in FIG. 1 or FIG. 2) that is remote from the system base 10 and the mounting modules 12 and controls the entirety of the system in an integrated manner. To this end, to the input and output interface 518 of each mounting module 12, the other mounting modules 12 and the system control device 530 are connected via a communication device such as a communication cable 532. In the case where the present mounting system is combined with another or other substrate-related-operation performing systems so as to constitute a still larger system, the system control device 530 is also used as a system control device for the other substrate-related-operation performing system or systems. Each one of the mounting modules 12 can be disconnected from the present mounting system, and can be connected to another mounting system. In the last case, the mounting-module control device 500 of the each mounting module 12 can be connected to respective control devices of the other substrate-related-operation performing apparatuses of the other mounting system, and/or a system control device of the other mounting system.

The ROM 514 of each mounting module 12 stores a basic control program. The RAM 516 stores various application programs, e.g., operation control programs to control various sorts of operations, and cooperative operations with the other substrate-related-operation performing apparatuses; and mount-position correcting programs to correct positional errors of the wiring board 30 held by the wiring-board holding device 32 and positional errors of the component 25 held by each suction nozzle 158. The RAM 516 additionally stores various data, e.g., data representing a mounting order pre-set for each sort of wiring boards 30 on which a component mounting operation is to be performed; data representing mount positions where components 25 are to be mounted; data representing sorts of components 25 to be mounted at mount positions; identification data identifying components 25 to be mounted; and component-supplying-device-related data representing what sort of components 25 are to be supplied from what tape feeder 26. Those data are also stored by a computer 540 of the system control device 530

In the mounting system constructed as described above, various preparing operations are performed before an initial mounting operation is started. A typical one of those preparing operations is to attach a mounting head 40, a component supplying device 24, and a nozzle stocker 330, to each of the mounting modules 12. In this preparing operation, it is possible to attach an "empty" nozzle stocker 330 holding no suction nozzles 158. However, here, it is assumed that the nozzle stocker 330 stores all suction nozzles 158 that are needed to mount components 25 on an initial sort of wiring boards 30. After the nozzle stocker 330 is attached to each mounting module 12, the mark-image taking device 178 takes respective images of the respective two-dimensional codes 226 of the suction nozzles 158 held by the nozzle stocker 330 attached thereto. Thus, the mark-image taking device 178 functions as a recognizing device that recognizes the respective two-dimensional codes 226 of the suction nozzles 158. As described above, each suction nozzle 158 is held by the nozzle stocker 330 such that the each nozzle 158 takes the predetermined angular position. Therefore, the mark-image taking device 178 can be moved to a position where the device 178 can be accurately opposed to the two-dimensional code 226 affixed to the background forming portion 220 of each suction nozzle 158, so that the device 178 actually takes an image of the code 226. Image data representing the taken image of the two-dimensional code 226 are processed by the image processing unit 528 so as to identify the specific sort of the each suction nozzle 158. Thus, nozzle storage data representing a relationship between the respective sorts of the suction nozzles 158 and the respective positions thereof in the nozzle stocker 330, are stored in a nozzle memory of the mounting-module control device 500, and are sent to, and stored in, the computer 540 of the system control device 530. Here, it is assumed that each nozzle stocker 330 holds two sets of suction nozzles 158 each one set of which consists of all, and only, sorts of suction nozzles 158 that are needed to mount components 25 on one sort of wiring boards 30 (in the case where the mounting head 40 holds a plurality of suction nozzles 158 of a same sort, the nozzle stocker 330 holds twice the number of suction nozzles 158 held by the head 40). The two sets of suction nozzles 158 held by the nozzle stocker 330 are used to replace one or more suction nozzles 158 that cannot be used any longer on the mounting head 40 because of, e.g., wearing or breakage. However, it is not essentially required that the nozzle stocker 330 hold twice the number of suction nozzles 158 held by the mounting head 40. For example, the nozzle stocker 330 may be adapted to hold only respective one suction nozzles 158 of all the sorts held by the mounting head 40, or may be adapted to hold no suction nozzles 158.

Nozzle storage data representing a relationship between the respective sorts of the suction nozzles 158 and the respective positions thereof in the nozzle stocker 330, may be prepared in advance by, e.g., an operator, and may be stored in the computer 540 of the system control device 530. In this case, after the nozzle stocker 330 is attached to each mounting module 12, the nozzle storage data may be confirmed by the image processing unit 528 as described above. If the respective positions of the suction nozzles 158 in the nozzle stocker 330 have been changed, the nozzle storage data are modified. There are some cases where after the nozzle stocker 330 is attached to each mounting module 12, the respective positions of the suction nozzles 158 in the nozzle stocker 330 are more or less changed by the operator. In those cases, the nozzle storage data can be confirmed by the image processing unit 528, and can be modified, as needed, by the operator, so that the nozzle storage data can be kept correct.

After the nozzle stockers 330 are attached to the mounting modules 12, respectively, the mounting head 40 of each mounting module 12 is moved to a position above the corresponding nozzle stocker 330 and, owing to the upward and downward movement of each of the nozzle holders 160 and the upward and downward movement of the holding-member support table 352, the nozzle holders 160 sequentially hold the suction nozzles 158 that are needed to mount components 25 on the current sort of wiring boards 30.

Next, a component mounting operation as a predetermined operation will be described. The component mounting operation is briefly described with respect to an example in which the operation is performed on a wiring board 30 having a size that can be accommodated by each mounting module 12. The wiring board 30, conveyed from an upstream side of the each mounting module 12, is stopped, by the wiring-board conveying device 34, at an operation performing position predetermined in the each module 12. At the operation performing position, the wiring board 30 is fixed and held by the wiring-board holding device 32, since the support plate 300 is elevated by the support-plate elevating and lowering device 308. Subsequently, the head moving device 44 is operated to move the mark-image taking device 178 to respective positions above the fiducial marks affixed to the wiring board 30, so that the device 178 takes respective images of the fiducial marks. Image data representing the taken images are processed to determine positional errors of the wiring board 30 held by the wiring-board holding device 32.

Then, the mounting head 40 is moved to a position above the component supplying device 24, and the suction nozzles 158 take, in the predetermined order, the components 25 from the component supplying device 24. More specifically described, the nozzle-holding holder 161 being positioned at the holder elevating and lowering station of the mounting head 40 is positioned at a position above the component-supply portion of the tape feeder 26 that is to supply the component 25 to be held by the holder 161, and is lowered at that position while a negative pressure is supplied to the suction nozzle 158 attached to the lower end of the holder 161. Thus, the suction nozzle 158 holds the component 25. Subsequently, the nozzle-holding holder 161 is revolved, and the next nozzle-holding holder 161 performs a similar component taking action. In this way, all the nozzle-holding holders 161 of the mounting head 40 sequentially perform respective component taking actions (i.e., eight component taking actions in total, in many cases).

Subsequently, the mounting head 40 holding the components 25 is moved to a position above the component-image taking device 50. At that position, all the components 25 held by the mounting head 40 fall in a field of view of the component-image taking device 50, and a single image of those components 25 is taken by the device 50. Image data representing the taken image are processed to determine positional errors of each of the components 25 held by the mounting head 40. Then, the mounting head 40 is moved to above the wiring board 30, while the nozzle-holding holders 161 are rotated to respective appropriate angular positions, by the holder rotating device 176, based on the respective predetermined angular positions at which the components 25 held by the holders 161 are to be mounted on the wiring board 30, the determined positional errors of the wiring board 30, and the determined positional errors of the components 25. More specifically described, the rotatable body 164 is intermittently rotated, or the nozzle-holding holders 161 are intermittently revolved, till the nozzle-holding holder 161 holding the component 25 to be mounted first is positioned at the holder elevating and lowering station, and the nozzle-holding holder 161 holding the first component 25 is rotated during the intermittent rotation or revolution.

After the mounting head 40 is moved to above the wiring board 30, the head 40 mounts, in the predetermined order, the components 25 held thereby, on the upper surface of the board 30. More specifically described, first, the nozzle-holding holder 161 being positioned at the holder elevating and lowering station of the head 40 is moved to a position above a predetermined mount position on the board 30. To this end, the position to which the holder 161 is moved is corrected based on the determined positional errors of the board 30 and the determined positional errors of the component 25 held by the holder 161. At that position, the holder 161 is lowered by the predetermined distance while a positive pressure is supplied to the suction nozzle 158 attached to the holder 161. Thus, the component 25 held by the holder 161 is mounted on the surface of the board 30. Subsequently, the nozzle-holding holders 161 are revolved, and the next nozzle-holding holder 161 performs a similar component mounting action. In this way, the nozzle-holding holders 161 holding the components 25 sequentially perform respective component mounting actions.

The mounting head 40 is reciprocated between the component supplying device 24 and the wiring board 30, till all the components 25 to be mounted are actually mounted on the board 30, while the component taking actions and the component mounting actions are repeated. After all the components 25 are mounted, the support-plate elevating and lowering device 308 of the wiring-board conveying device 34 is operated to lower the support plate 300, so as to release the wiring board 30 from its fixed and held state. Then, the wiring board 30 is conveyed, by the wiring-board conveying device 34, to a downstream side of each mounting module 12. In this way, the component mounting operation related to one wiring board 30 is finished. The present mounting system can also perform a component mounting operation on a wiring board 30 having a size that bridges two mounting modules 12 located adjacent to each other in the system.

When the current sort of wiring boards 30 are changed to a different sort of wiring boards 30, resetting operations are performed. The resetting operations include, e.g., exchanging the feeders 26 of the component supplying devices 24, exchanging the mounting heads 40 and the nozzle stockers 330, and adjusting the respective widths of the two pairs of rails 250 and 252, 254 and 256. If it is needed to exchange one or more suction nozzles 158 used in an arbitrary one of the mounting modules 12, first, the suction nozzle or nozzles 158 is or are exchanged and then the width(s) of one or both pair(s) of rails is or are adjusted, because all the nozzle carrier plates 400 have a considerably large, same width.

Figure 19:
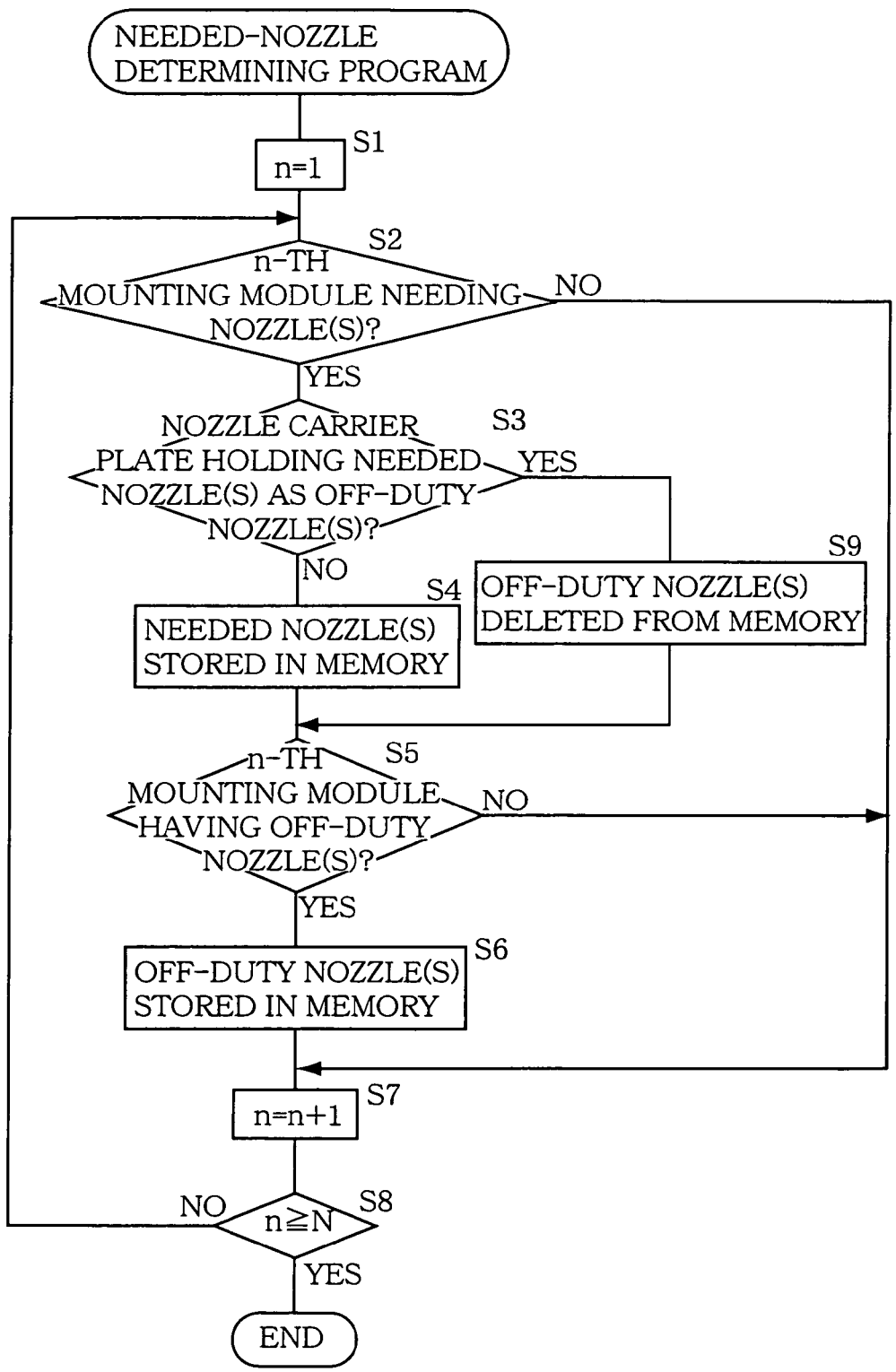
FIG. 19 is a flow chart representing a needed-nozzle determining program that is implemented by the control device.

One or more suction nozzles 158 needed in the resetting operations are supplied to each mounting module 12 by the wiring-board conveying device 34. First, one or more suction nozzles 158 needed for the next component mounting operation are manually mounted on the nozzle carrier plate 400 by the operator. The needed suction nozzles 158 are determined according to a needed-nozzle determining program represented by a flow chart shown in FIG. 19. The control device 500 of each of the mounting modules 12 may be so constructed as to be able to function as a host computer that controls the present electronic-circuit-component mounting system as a whole, and have, as one of various functions of the host computer, a function of implementing the needed-nozzle determining program. In the present embodiment, however, the computer 540 of the system control device 530 implements the needed-nozzle determining program. Meanwhile, the exchanging of one or more suction nozzles 158 is done in an order from the most upstream mounting module 12 toward the most downstream mounting module 12. The needed-nozzle determining program is prepared under this condition.

First, at Step S1, an integer, n, is set to n=1. Subsequently, at Step S2, the computer 540 judges whether the "n-th" mounting module 12 as counted from the most upstream mounting module 12 needs any suction nozzles 158, i.e., whether there are any suction nozzles 158 that are needed to mount the components 25 on the next sort of wiring boards 30 but are not held by either the nozzle stocker 330 or the mounting head 40. If a negative judgment is made at Step S2, Steps S3 and the following steps are skipped. On the other hand, if a positive judgment is made at Step S2, the control of the computer 540 proceeds with Step S3 to judge whether the nozzle carrier plate 400 holds the needed suction nozzle(s) 158 as off-duty suction nozzle(s) 158. In the present embodiment, it is assumed that at the beginning, the nozzle carrier plate 400 holds no suction nozzles 158, i.e., is empty (therefore, the nozzle memory stores no data). Therefore, at the beginning, a negative judgment is made at Step S3, and the control goes to Step S4 to store data indicating the needed suction nozzle(s) 158, in the nozzle memory. Then, at Step S5, the computer 540 judges whether the "n-th" mounting module 12 has any suction nozzles 158 that are not needed to mount the components 25 on the next sort of wiring boards 30. If a positive judgment is made at Step S5, the control goes to Step S6 to store data indicating that or those suction nozzle(s) 158 as off-duty suction nozzle(s), in the nozzle memory. Subsequently, the control goes to Step S7 to add one to the integer n. On the other hand, if a negative judgment is made at Step S2 or Step S5, the control directly goes to Step S7.

Thus, in the case where Step S3 is implemented when the integer n is not smaller than two, that is, in the case where the computer 540 judges, for the second or following mounting module 12 as counted from the most upstream mounting module 12, whether the nozzle carrier plate 400 holds, as the off-duty suction nozzle(s) 158, the suction nozzle(s) 158 needed by the second or following mounting module 12, a positive judgment may be made at Step S3, because the off-duty suction nozzle(s) 158 may have been stored in the nozzle memory. In this case, the computer 540 compares the needed suction nozzle(s) 158, determined at Step S2, with the off-duty suction nozzle(s) 158 stored in the nozzle memory. If those suction nozzles 158 agree with each other, a positive judgment is made at Step S3, and the control goes to Step S9 to delete the data indicating the off-duty suction nozzle(s), from the nozzle memory. In short, in the case where a certain mounting module 12 needs one or more suction nozzles 158 and simultaneously another mounting module 12 located on the upstream side of the certain module 12 has the needed suction nozzle(s) 158 as off-duty suction nozzle(s) 158, the certain module 12 can use the off-duty suction nozzle(s) 158 as the needed suction nozzle(s) 158. Thus, since the off-duty suction nozzle(s) 158 for the upstream module 12 are the needed suction nozzle(s) 158 for the downstream module 12, the data indicating the off-duty suction nozzle(s) 158 are deleted from the nozzle memory.

Step S7 is followed by Step S8 to judge whether the integer n is not smaller than a pre-set number, N. If a negative judgment is made at Step S8, the control goes back to Step S2 and the following steps. On the other hand, if a positive judgment is made at Step S8, the control quits the present program. The number N is pre-set at the total number of the mounting modules 12 of the present electronic-circuit-component mounting system. Thus, the positive judgment made at Step S8 indicates that the needed suction nozzle(s) has or have been determined for all the mounting modules 12. Therefore, the suction nozzle(s) 158 that is or are stored as the needed suction nozzle(s) in the nozzle memory when the positive judgment is made at Step S8, is or are needed to mount the components 25 on the next sort of wiring boards 30. In addition, the suction nozzle(s) 158 that is or are stored as the off-duty suction nozzle(s) in the nozzle memory when the positive judgment is made at Step S8, should be removed from the present system as a whole.

Based on the data indicating the needed suction nozzle(s) and the data indicating the off-duty suction nozzle(s), a display device, such as a monitor, displays information representing the sort(s) and number(s) of the needed suction nozzle(s) that should be held by the nozzle carrier plate 400, and the off-duty suction nozzle(s) that should be removed from the present electronic-circuit-component mounting system and should be returned to the nozzle carrier plate 400. Based on the displayed information, the operator attaches, outside the mounting system, the needed suction nozzle(s) to the nozzle carrier plate 400, whereby the plate 400 holds the needed nozzle(s). Those nozzle(s) may be attached to any positions on the plate 400. In addition, the operator judges whether the nozzle carrier plate 400 has one or more "empty" nozzle-holding holes 404 enough to hold one or more off-duty suction nozzles in the mounting system.

Each of the mounting modules 12 has a function of judging, during the component mounting operation in which the components 25 are mounted on the wiring boards 30, whether any suction nozzles 158 of the mounting head 40 have become defective, i.e., not appropriate for continued use in the mounting operation. Though this function is not described in detail because it is not relevant to the present invention, each mounting module 12 can automatically exchange the defective suction nozzle(s) 158 of the mounting head 40 with the normal suction nozzle(s) 158 held by the nozzle stocker 330. In addition, data indicating the fact that the defective suction nozzle(s) 158 has or have occurred, and data indicating the position(s) where the defective suction nozzle(s) 158 is or are held by the nozzle stocker 330 are stored in the computer 540 of the system control device 530. The computer 540 implements a different control program, not shown, than the above-described needed-nozzle determining program, and judges whether the sort(s) of the defective suction nozzle(s) 158 is or are needed to mount the components 25 on the next sort of wiring boards 30. If the sort(s) of the defective suction nozzle(s) is or are judged as being needed, the computer 540 controls the display device to display information indicating that the nozzle carrier plate 400 should hold one or more normal suction nozzles 158 to replace the defective suction nozzle(s) 158. On the other hand, if the sort(s) of the defective suction nozzle(s) 158 is or are judged as being not needed, the computer 540 controls the display device to display information indicating that the operator should discard the defective suction nozzle(s) 158 that is or are held and carried out by the nozzle carrier plate 400. Based on the information displayed by the display device, the operator takes necessary actions.

In this way, the operator confirms that the nozzle carrier plate 400 holds all the needed suction nozzles 158 and has the empty holes 404 that can hold all the off-duty suction nozzles 158. After the operator places the nozzle carrier plate 400 on one of the front and rear conveyors 260, 262 of the wiring-board conveying device 34 (e.g., the front conveyor 260), the operator operates a manually operable member to command commencement of a nozzle changing operation. Thus, the nozzle carrier plate 400 is conveyed, and is positioned and held by the wiring-board holding device 32 of the most upstream mounting module 12. Subsequently, the mark-image taking device 178 is moved to above the nozzle carrier plate 400 so as to take the respective images of the fiducial marks 418 affixed to the carrier plate 400. Based on the image data representing the taken images, the positional errors of the nozzle carrier plate 400 held by the holding device 32 are determined. In addition, the mark-image taking device 178 takes the respective images of the respective two-dimensional codes 226 of the suction nozzles 158 held by the carrier plate 400. Like the suction nozzles 158 held by the nozzle stocker 330, the suction nozzles 158 are held by the nozzle carrier plate 400 such that the nozzles 158 take the respective predetermined angular positions. Therefore, like the manner in which the mark-image taking device 178 takes the images of the two-dimensional codes 226 of the suction nozzles 158 held by the nozzle stocker 330, the image taking device 178 is moved to respective positions where the device 178 is opposed to the respective two-dimensional codes 226 of the suction nozzles 158 held by the carrier plate 400, and takes the respective images of those codes 226. Based on the image data representing the taken images of the codes 226, the respective sorts of those suction nozzles 158 are identified and, based on the respective amounts of movement of the image taking device 178 in the X-axis and Y-axis directions, the respective positions of the suction nozzles 158 on the nozzle carrier plate 400 are determined. The nozzle storage data representing the identified sorts, and determined positions, of the suction nozzles 158 are stored in the RAM 516 of the control device 500 of the most upstream mounting module 12, and are sent to, and stored by, the computer 540 of the system control device 530.

The computer 540 of the system control device 530 compares the data (hereinafter, referred to as the module-related data) representing the sorts and positions of the suction nozzles 158 held by the nozzle stocker 330, and the mounting head 40, of the most upstream mounting module 12 before the nozzle changing operation is started (i.e., at the time when the component mounting operation on the previous sort of wiring boards 30 had been finished), with the above-described nozzle storage data that represent the sorts and positions of the suction nozzles 158 held by the nozzle carrier plate 400 and are stored in the computer 540, and identifies, with respect to the module-related data, the suction nozzles 158 needed for performing the next component mounting operation, and the suction nozzles 158 not needed for that purpose. Then, those off-duty suction nozzles 158 are returned to the nozzle carrier plate 400. In the case where the mounting head 40 holds one or more off-duty suction nozzles 158, the head 40 is moved to above the carrier plate 400, and returns the off-duty suction nozzle or nozzles 158 to one or more empty holes 404 of the plate 400. In the case where the nozzle stocker 330 holds one or more off-duty suction nozzles 158, the mounting head 40 is first moved to above the nozzle stocker 330 so as to return one or more suction nozzles 158 held thereby, to the stocker 330, and then one or more nozzle holders 160 of the head 40 takes or take one or more off-duty suction nozzles 158 from the stocker 330. Subsequently, the head 40 is moved to above the carrier plate 400, and returns the off-duty suction nozzle or nozzles 158 to one or more empty holes 404 of the plate 400 in the same manner as described above. To this end, the position or positions to which the head 40 is moved is or are adjusted based on the determined positional errors of the carrier plate 400 held by the wiring-board holding device 32. In each of the above-described two cases, first data representing the sort(s) of the off-duty suction nozzle(s) 158 returned to the carrier plate 400, and second data representing the position(s) of the hole(s) 404 that holds or hold the returned off-duty nozzle(s) 158 are stored in the computer 540 such that the first and second data are associated with each other. In addition, the mounting head 40 is operated to convey one or more needed suction nozzles 158 from the nozzle carrier plate 400 to the nozzle stocker 330, or one or more nozzle holders 160 of the head 40 are operated to take and hold one or more needed suction nozzles 158 from the carrier plate 400. Data representing those facts are also stored in the computer 540.

At least one of the nozzle holders 160 of the mounting head 40 can be used in a nozzle changing operation in which suction nozzles 158 are exchanged with each other, or are replenished. For example, only one of the nozzle holders 160 of the mounting head 40 may be exclusively used in the nozzle changing operation, i.e., may be used to hold a needed suction nozzle 158 or an off-duty suction nozzle 158. Alternatively, all the nozzle holders 160 of the mounting head 40 may be used in the nozzle changing operation. In the latter case, first, the respective suction nozzles 158 held by all the nozzle holders 160 are turned to the nozzle stocker 330 or the nozzle carrier plate 400, so that the nozzle holders 160 become empty, subsequently the nozzle holders 160 are sequentially operated to take the needed suction nozzles 158 from the carrier plate 400 and convey the same 158 to the nozzle stocker 330. In the latter case, since all the nozzle holders 160 are used in the nozzle changing operation, it is possible to avoid advantageously wearing of one or more specific nozzle holders 160 only as a portion of all the nozzle holders 160 which portion is exclusively used in the nozzle changing operation. In addition, in a particular case where there are many suction nozzles 158 that need to be exchanged or replenished, the nozzle changing operation can be efficiently performed using all the nozzle holders 160 of the mounting head 40.

After the nozzle changing operation is finished in the most upstream mounting module 12, the nozzle carrier plate 400 is released from the wiring-board holding device 32, and is conveyed by the wiring-board conveying device 34 toward the mounting modules 12 that are located on the downstream side of the most upstream mounting module 12, so that the carrier plate 400 is positioned and held by the wiring-board holding device 32. More specifically described, the carrier plate 400 is stopped in one of the downstream-side mounting modules 12 that needs to perform the nozzle changing operation, and is held by the wiring-board holding device 32 of the one mounting module 12. In the one mounting module 12, the nozzle changing operation is performed in the same manner as described above. The data representing the sorts and positions of the suction nozzles 158 held by the nozzle carrier plate 400 have been stored, and the data representing the sorts and positions of the needed suction nozzles 158 that have been replenished and the off-duty suction nozzles 158 that have been returned have also been stored. Since the nozzle changing operation can be performed based on those stored data, it is not needed to operate the mark-image taking device 178 to take the respective images of the respective two-dimensional codes 226 of the suction nozzles 158 again.

When, in this way, the nozzle changing operation has been finished, and other sorts of resetting operations have been performed, in each of the mounting modules 12, the present component mounting system performs the next component mounting operation in the same manner as described above.

In the present embodiment, each suction nozzle 158 is an example of a constituent element; the nozzle carrier plate 400 is an example of an element carrier plate; and the nozzle stocker 330 is an example of an element stocker. The nozzle memory of the computer 540 of the system control device 530 or the RAM 516 of the mounting-module control device 500 of each mounting module 12 constitutes an element-code memory; and the component mounting device 46 and the above-indicated element-code memory constitute an element exchanging device. The wiring-board conveying device 34 of each mounting module 12 is an example of a substrate conveyor. Each of the nozzle holders 160 of the mounting head 40 is an example of a head-side nozzle holding portion; the nozzle holding member 340 (or each of the nozzle holding holes 342) of the nozzle stocker 330 is an example of a stocker-side nozzle holding portion; and the nozzle holding member 406 (or each of the nozzle holding holes 404) of the nozzle carrier plate 400 is an example of a plate-side nozzle holding portion. The two-dimensional code 226 is an example of an identification-code recording portion where an identification code is recorded; and the mark-image taking device 178 constitutes a reading device that reads the identification code recorded in the recording portion. The mounting-head moving device 44 constitutes a relatively moving device. The mounting-module control device 500 of each mounting module 12 includes a portion that controls the mounting-head moving device 44 to move the mounting head 40 so that the nozzle holders 160 take the suction nozzles 158 from the nozzle carrier plate 400, and this portion constitutes a nozzle-receiving control device. In addition, the mounting-module control device 500 includes a portion that controls the mounting-head moving device 44 so that the suction nozzles 158 are exchanged between the nozzle carrier plate 400 and the nozzle stocker 330, and this portion constitutes a nozzle-exchange control device.

In the present component mounting system, the mounting modules 12 are arranged adjacent to each other. Thus, there is a tendency that each mounting module 12 is reduced in size, and accordingly it may be difficult to provide a sufficiently large work space in the each mounting module 12. Conventionally, a nozzle exchanging operation has been performed by an operator in such a manner that in a considerably small work space of each mounting module 12, the operator checks suction nozzles against a nozzle-arrangement table for the next sort of wiring boards. In addition, as the number of mounting modules 12 that are arranged adjacent to each other increases, the longer time is needed to perform the resetting operations, and the more easily various errors occur, such as errors of arranging of suction nozzles by the operator. Since it is difficult to provide a sufficiently large work space in a small component mounting apparatus, it is difficult for the operator to perform the nozzle exchanging operation in the small component mounting apparatus. In contrast, in the present embodiment, the suction nozzles 158 to be exchanged are conveyed on the nozzle carrier plate 400 into each mounting module 12, and the mounting head 40 is used to exchange automatically the suction nozzles 158. Thus, the load of the operator is reduced, and the operator can be fully engaged in a feeder exchanging operation in which the feeders 26 of the component supplying device 24 are exchanged. Since the nozzle exchanging operation that is automatically controlled, and the feeder exchanging operation that is done by the operator can be simultaneously performed, the time needed to perform the resetting operations can be shortened, which leads to increasing an operation rate of the present, expensive mounting system. Moreover, the accuracy of the feeder exchanging operation is improved. Furthermore, personnel expenses needed to perform the resetting operations can be reduced. Thus, as the total number of the mounting modules 12 employed by the mounting system is increased, the above-described advantages resulting from the automatic exchanging of the suction nozzles 158 can be enhanced.

Figure 18:
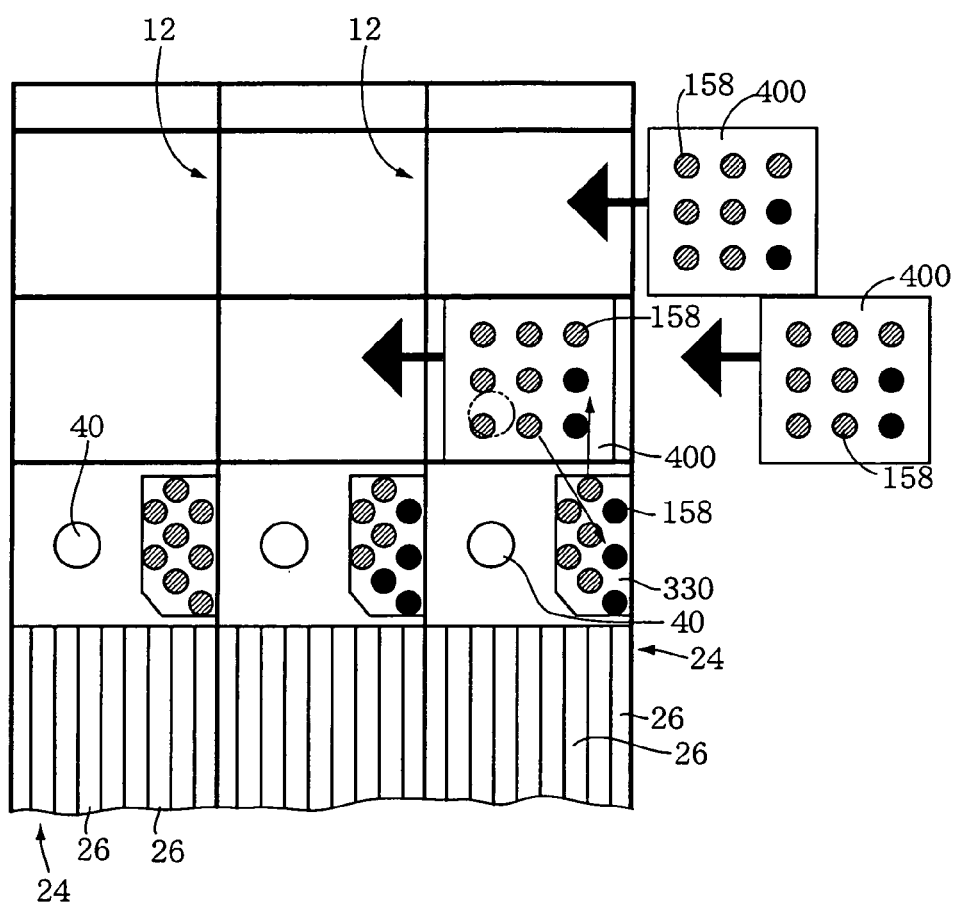
FIG. 18 is a view for explaining a nozzle exchanging operation that is performed between the nozzle carrier plate and a nozzle stocker in the electronic-circuit-component mounting system.

In the illustrated embodiment, the single nozzle carrier plate 400 is used to replenish the suction nozzles 158 to all the mounting modules 12. However, in the case where there are many suction nozzles 158 to be held but the single carrier plate 400 cannot hold all those suction nozzles 158, it is possible to use two or more nozzle carrier plates 400 so that those carrier plates 400 share those suction nozzles 158. In this case, though it is possible to convey the two or more carrier plates 400 using one of the front and rear conveyors 260, 262, it is possible to convey, as shown in FIG. 18, the carrier plates 400 using both the two conveyors 260, 262. For example, if two nozzle carrier plates 400 are concurrently conveyed by the two conveyors 260, 262, respectively, the nozzle replenishing operation can be performed in a reduced time.

As described above, in the preparing operation before the initial component mounting operation, each mounting module 12 is provided with the nozzle stocker 330 holding all the needed suction nozzles 158. However, in the preparing operation, each mounting module 12 may be provided with the empty nozzle stocker 330, and the nozzle carrier plate 400 holding all the needed suction nozzles 158 may be conveyed to the each mounting module 12. In this case, in the each mounting module 12, the empty nozzle holders 160 of the mounting head 40 may be operated to take the respective needed suction nozzles 158 from the carrier plate 400 and transfer the same 158 to the nozzle stocker 330. Also, when the resetting operations are performed between two component mounting operations corresponding to different sorts of wiring boards 30, respectively, it is possible to remove all the suction nozzles 158 from the mounting system and then replenish all the needed suction nozzles 158 to the system.

In the illustrated embodiment, all the off-duty suction nozzles 158 that are not needed by each mounting module 12 to perform the component mounting operation on the next sort of wiring boards 30, are returned to the nozzle carrier plate 400. However, this is not essentially required. For example, each mounting module 12 may be adapted such that only when the nozzle stocker 330 cannot afford to hold all the needed suction nozzles 158, the off-duty suction nozzles 158 are returned to the nozzle carrier plate 400.

In the illustrated embodiment, when the suction nozzles 158 are held by each of the nozzle stockers 330 and the nozzle carrier plate 400, the positioning device including the positioning pin 338 or 428 positions each suction nozzle 158 at the predetermined angular position. However, the positioning pin 338, 428 may be omitted. For example, the mounting head 40 may be so controlled as to place each suction nozzle 158 at the predetermined angular position on each of the nozzle stockers 330 and the nozzle carrier plate 400. In this case, too, the mark-image taking device 178 can be moved to a position above the upper surface 224 of each suction nozzle 158 and can be operated to take an image of a portion of the upper surface 224 which portion contains the two-dimensional code 226.

However, even in the case where each of the nozzle stockers 330 and the nozzle carrier plate 400 is not adapted to be able to hold each suction nozzle 158 at the predetermined angular position, it is possible to detect the two-dimensional code 226 of the each suction nozzle 158. For example, each suction nozzle 158 may be so modified as to have, on the upper surface 224 of the background forming portion 220 thereof, a number of two-dimensional codes 226 at respective positions distant from each other in a circumferential direction of the upper surface 224, so that if the mark-image taking device 178 takes an image of any portion of the background forming portion 220, the taken image always contains a complete image of at least one two-dimensional code 226. Alternatively, the mark-image taking device 178 may be intermittently moved at a predetermined angular pitch in the circumferential direction of the upper surface 224 of each suction nozzle 158, while taking respective images of a plurality of sector portions of the upper surface 224 each of which portions corresponds to the predetermined angular pitch. In the latter case, the each suction nozzle 158 may have one or more two-dimensional codes 226 on the upper surface 224 thereof. Moreover, in the case where each suction nozzle 158 has, on the upper surface 224 thereof, the two-dimensional code 226 such that the surface 224 and the code 226 have significantly different optical characteristics, e.g., degrees of brightness (for example, the surface 224 forms a white background whereas the code 226 has a dark color such as black), it is possible to detect the presence of the code 226. To this end, the mark-image taking device 178 may be operated, as described above, to take the respective images of the sector portions of the surface 224 each of which portions corresponds to the predetermined angular pitch. If a total number of "dark" picture elements in each of the thus taken images is greater than a reference number, the each taken image is further processed to find the code 226. That is, if the total number of dark picture elements in each of the taken images is greater than the reference number, the each image may contain, at a high probability, a complete image of the code 226. However, if the results of processing of the each image indicate that the code 226 cannot be recognized, it can be estimated that only a portion of the code 226 falls outside the field of view of the mark-image taking device 178. Hence, it is desirable that the mark-image taking device 178 be moved by a small incremental angle in the circumferential direction of the surface 224 so as to attempt again to recognize the code 226.

The two-dimensional code 226 of each suction nozzle 158 may be recognized by not the mark-image taking device 178 but a dedicated device that is dedicated to recognize the two-dimensional codes 226.

In the illustrated embodiment, each suction nozzle 158 is mechanically attached to, and detached from, each nozzle holder 160. However, as disclosed by, e.g., Japanese Patent No. 2,824,378, each nozzle holder 160 may be so modified as to hold, by suction, each suction nozzle 158. In this case, it is not needed to modify the nozzle stockers 330 or the nozzle carrier plate 400. However, in the case where each nozzle holder 160 holds, by suction, each suction nozzle 158, each of the nozzle stockers 330 and the carrier plate 400 may be so modified not to employ the coming-off preventing member 344, 420. In this case, when each suction nozzle 158 is returned to each nozzle stocker 330 or the carrier plate 400, the supply of suction to each nozzle holder 160 is stopped; and when the each nozzle holder 160 holds the each suction nozzle 158, the suction is supplied to the each nozzle holder 160.

While the present invention has been described in its preferred embodiments, it is to be understood that the present invention is not limited to the details of those embodiments but may be embodied with various changes and improvements, such as those described in SUMMARY OF THE INVENTION, that may occur to a person skilled in the art.

The invention claimed is:

1. A method of, in an operation-performing-apparatus line including a plurality of operation performing apparatuses which perform respective predetermined operations related to a circuit substrate and a substrate conveyor which extends through each of the operation performing apparatuses and conveys the circuit substrate to said each operation performing apparatus, exchanging at least one first exchangeable constituent element of at least one operation performing apparatus of the plurality of operation performing apparatuses, with at least one second constituent element, said at least one operation performing apparatus including an element stocker, a transferring head movable relative to the element stocker, and at least one apparatus-side element-holding portion for holding said at least one first exchangeable constituent element, the method comprising the steps of causing an element carrier plate to hold said at least one second constituent element such that said at least one second constituent element is detachable from the element carrier plate, causing the substrate conveyor to convey the element carrier plate from one of opposite ends of the operation-performing- apparatus line toward an other end thereof, stopping the element carrier plate in said at least one operation performing apparatus, automatically transferring, with the transferring head of said at least one operation performing apparatus, said at least one second constituent element from the element carrier plate to the element stocker of said at least one operation performing apparatus, and automatically replacing said at least one first constituent element held by said at least one apparatus-side element-holding portion of said at least one operation performing apparatus, with said at least one second constituent element transferred to the element stocker.

2. The method according to claim 1, wherein the element carrier plate is caused to hold the respective second constituent elements corresponding to the respective first constituent elements of at least two operation performing apparatuses of the plurality of operation performing apparatuses, said at least two operation performing apparatuses including respective transferring heads, respective element stockers, and respective apparatus-side element-holding portions for holding the respective first constituent elements, and wherein the element carrier plate is stopped in each of said at least two operation performing apparatuses, the respective second constituent elements are automatically transferred, with the respective transferring heads, from the element carrier plate to the respective element stockers, and the respective first constituent elements held by the respective apparatus-side element-holding portions are automatically replaced with the respective second constituent elements transferred to the respective elementstockers.

3. The method according to claim 1, wherein said at least one operation performing apparatus comprises at least one component mounting apparatus having a mounting head functioning as the transferring head and including, as said at least one apparatus-side element-holding portion, at least one nozzle-holding portion which holds, as said at least one first constituent element, at least one first suction nozzle such that said at least one first suction nozzle is detachable from said at least one nozzle-holding portion, wherein said at least one first suction nozzle holds, by suction, at least one electronic-circuit component and mounts said at least one electronic-circuit component on the circuit substrate which is conveyed by the substrate conveyor and is held by a substrate holding device of said at least one component mounting apparatus, and wherein a nozzle carrier plate as the element carrier plate is caused to hold, as said at least one second constituent element, at least one second suction nozzle, and is conveyed by the substrate conveyor to said at least one component mounting apparatus, and said at least one first suction nozzle held by said at least one nozzle- holding portion of the mounting head is automatically returned to the nozzle carrier plate.

4. The method according to claim 1, wherein said at least one operation performing apparatus comprises at least one component mounting apparatus having a mounting head functioning as the transferring head and including, as a first one of a plurality of said apparatus-side element-holding portions, a head-side nozzle-holding portion which holds, as one of a plurality of said first constituent elements, one of a plurality of first suction nozzles such that said one first suction nozzle is detachable from the head-side nozzle-holding portion, wherein said one first suction nozzle holds, by suction, an electronic-circuit component and mounts the electronic-circuit component on the circuit substrate which is conveyed by the substrate conveyor and is held by a substrate holding device of said at least one component mounting apparatus, wherein said at least one component mounting apparatus can automatically exchange said one first suction nozzle held by the head-side nozzle-holding portion of the mounting head, with an other of the first suction nozzles that is held by a nozzle stocker as each of (a) the element stocker and (b) a second one of the plurality of apparatus-side element-holding portions, and wherein a plurality of plate-side nozzle-holding portions of a nozzle carrier plate as the element carrier plate are caused to hold, as a plurality of said second constituent elements, a plurality of second suction nozzles, respectively, the nozzle carrier plate is conveyed by the substrate conveyor to said at least one component mounting apparatus, and at least one of the first suction nozzles that is held by the nozzle stocker is automatically exchanged, with the mounting head, with at least one of the second suction nozzles held by the nozzle carrier plate.

5. The method according to claim 4, wherein the operation-performing-apparatus line comprises a component-mounting-apparatus line including a plurality of component mounting apparatuses which are arranged in an array, and wherein the substrate conveyor is caused to convey the nozzle carrier plate to an arbitrary one of the component mounting apparatuses, and said at least one first suction nozzle held by the nozzle stocker of the arbitrary component mounting apparatus is automatically exchanged with said at least one of the second suction nozzles held by the nozzle carrier plate.

6. The method according to claim 5, wherein the plurality of component mounting apparatuses comprise a plurality of modules, respectively, which have respective identical constructions and which are arranged adjacent to each other to constitute the component-mounting- apparatus line, and wherein said at least one first suction nozzle held by the nozzle stocker of an arbitrary one of the modules is automatically exchanged with said at least one of the second suction nozzles held by the nozzle carrier plate.

7. The method according to claim 1, wherein the element stocker of said at least one operation performing apparatus which performs the predetermined operation related to the circuit substrate includes said at least one apparatus-side element-holding portion that holds said at least one first exchangeable constituent element that is needed to perform the operation, and wherein the method comprises automatically exchanging said at least one first constituent element held by said at least one apparatus-side element-holding portion of the element stocker, with said at least one second constituent element held by the element carrier plate.

8. The method according to claim 7, wherein said at least one operation performing apparatus includes, in addition to the element stocker, an additional element-holding portion which holds one of a plurality of said first constituent elements such that said one first constituent element is detachable from the additional element-holding portion, wherein said at least one operation performing apparatus performs the operation with said one first constituent element held by the additional element-holding portion, and wherein said at least one operation performing apparatus includes an exchanging device which automatically exchanges said one first constituent element held by the additional element-holding portion, with an other of the first constituent elements that is held by the element stocker, and automatically exchanges said at least one first constituent element held by the element stocker, with said at least one second constituent element held by the element carrier plate.

9. The method according to claim 8, wherein said at least one operation performing apparatus comprises a component mounting apparatus having, as the element stocker, a nozzle stocker which holds, as said at least one first constituent element, at least one of a plurality of first suction nozzles, and additionally having a mounting head including, as the additional element-holding portion, a head-side nozzle-holding portion which holds, as said one first constituent element, one of the first suction nozzles such that said one first suction nozzle is detachable from the head-side nozzle-holding portion, wherein said one first suction nozzle holds, by suction, an electronic-circuit component, and mounts the electronic-circuit component on the circuit substrate which is conveyed by the substrate conveyor and is held by a substrate holding device of the component mounting apparatus, wherein the component mounting apparatus can automatically exchange said one first suction nozzle held by the head-side nozzle-holding portion of the mounting head, with an other of the first suction nozzles that is held by the nozzle stocker, and wherein a plurality of plate-side nozzle-holding portions of a nozzle carrier plate as the element carrier plate are caused to hold, as a plurality of said second constituent elements, a plurality of second suction nozzles, respectively, the nozzle carrier plate is conveyed by the substrate conveyor to the component mounting apparatus, and the component mounting apparatus automatically exchanges said at least one first suction nozzle held by the nozzle stocker, with at least one of the second suction nozzles held by the nozzle carrier plate.

10. The method according to claim 7, wherein each one of said at least one first constituent element and said at least one second constituent element includes an identification-code recording portion where an identification code which identifies said each one constituent element from an other of said at least one first constituent element and said at least one second constituent element is recorded, wherein said at least one operation performing apparatus further includes a reading device which reads the respective identification codes from the respective identification-code recording portions of said at least one first constituent element and said at least one second constituent element, wherein the operation-performing-apparatus line further comprises an element-code memory in which the respective identification codes of said at least one first constituent element held by the element stocker and said at least one second constituent element held by the element carrier plate are stored, and wherein, based on the respective identification codes stored in the element-code memory and the respective identification codes read by the reading device, said at least one first constituent element held by the element stocker is automatically exchanged with said at least one second constituent element held by the element carrier plate.

11. The method according to claim 1, wherein each one of said at least one first constituent element and said at least one second constituent element includes an identification-code recording portion where an identification code which identifies said each one constituent element from an other of said at least one first constituent element and said at least one second constituent element is recorded, wherein said at least one operation performing apparatus further includes a reading device which reads the respective identification codes from the respective identification-code recording portions of said at least one first constituent element and said at least one second constituent element, and wherein, based on the respective identification codes read by the reading device, said at least one first constituent element held by said at least one apparatus-side element-holding portion is automatically replaced with said at least one second constituent element transferred to the element stocker.

12. The method according to claim 1, further comprising automatically returning, with the transferring head, said at least one first constituent element from said at least one apparatus-side element-holding portion, to the element stocker.

13. The method according to claim 1, further comprising automatically returning, with the transferring head, said at least one first constituent element from said at least one apparatus-side element-holding portion, to the element carrier plate.

14. The method according to claim 1, further comprising a step of arranging the operation performing apparatuses such that each of the operation performing apparatuses is movable in each of opposite directions that are perpendicular to a circuit-substrate conveying direction in which the circuit substrate is conveyed by the substrate conveyor.

15. The method according to claim 14, wherein the step of arranging the operation performing apparatuses comprises providing, as the operation performing apparatuses, a plurality of modules having respective identical constructions, on a base, such that each of the modules is movable in said each of the opposite directions on the base.

* * * * *